United States Patent
Brogan et al.

(10) Patent No.: US 7,446,018 B2
(45) Date of Patent: Nov. 4, 2008

(54) BONDED-WAFER SUPERJUNCTION SEMICONDUCTOR DEVICE

(75) Inventors: Conor Brogan, Belfast (GB); Cormac MacNamara, Belfast (GB); Hugh J. Griffin, Newtownabbey (GB); Robin Wilson, Newtownards (GB)

(73) Assignee: Icemos Technology Corporation, Tempe, AZ (US)

( * ) Notice: Subject to any disclaimer, the term of this patent is extended or adjusted under 35 U.S.C. 154(b) by 303 days.

(21) Appl. No.: 11/466,132

(22) Filed: Aug. 22, 2006

(65) Prior Publication Data

US 2007/0063217 A1    Mar. 22, 2007

Related U.S. Application Data

(60) Provisional application No. 60/710,234, filed on Aug. 22, 2005.

(51) Int. Cl.
*H01L 21/30* (2006.01)
*H01L 21/46* (2006.01)

(52) U.S. Cl. ................................... 438/459
(58) Field of Classification Search .......... 438/107, 438/109, 455–459; 257/549, 637
See application file for complete search history.

(56) References Cited

U.S. PATENT DOCUMENTS

| | | | |
|---|---|---|---|
| 4,158,206 A | 6/1979 | Neilson | |
| 4,211,582 A | 7/1980 | Horng et al. | |
| 4,238,278 A | 12/1980 | Antipov | |
| 4,491,486 A | 1/1985 | Iwai | |
| 4,771,016 A | 9/1988 | Bajor et al. | |
| 4,866,004 A | 9/1989 | Fukushima | |
| 4,895,810 A | 1/1990 | Meyer et al. | |
| 4,994,406 A | 2/1991 | Vasquez et al. | |
| 5,019,522 A | 5/1991 | Meyer et al. | |
| 5,045,903 A | 9/1991 | Meyer et al. | |
| 5,216,275 A | 6/1993 | Chen | |
| 5,266,135 A | 11/1993 | Short et al. | |
| 5,334,273 A | 8/1994 | Short et al. | |
| 5,362,667 A | 11/1994 | Linn et al. | |
| 5,366,914 A | 11/1994 | Takahashi et al. | |
| 5,387,555 A * | 2/1995 | Linn et al. | ............ 438/455 |

(Continued)

FOREIGN PATENT DOCUMENTS

WO    2005001941 A3    1/2005

(Continued)

*Primary Examiner*—Calvin Lee
(74) *Attorney, Agent, or Firm*—Panitch Schwarze Belisario & Nadel LLP

(57) ABSTRACT

A bonded-wafer semiconductor device includes a semiconductor substrate, a buried oxide layer disposed on a first main surface of the semiconductor substrate and a multi-layer device stack. The multi-layer device stack includes a first device layer of a first conductivity disposed on the buried oxide layer, a second device layer of a second conductivity disposed on the first device layer, a third device layer of the first conductivity disposed on the second device layer and a fourth device layer of the second conductivity disposed on the third device layer. A trench is formed in the multi-layer device stack. A mesa is defined by the trench. The mesa has first and second sidewalls. A first anode/cathode layer is disposed on a first sidewall of the multi-layer device stack, and a second anode/cathode layer is disposed on the second sidewall of the multi-layer device stack.

18 Claims, 17 Drawing Sheets

U.S. PATENT DOCUMENTS

| | | | |
|---|---|---|---|
| 5,395,790 | A | 3/1995 | Lur |
| 5,432,113 | A | 7/1995 | Tani |
| 5,435,888 | A | 7/1995 | Kalnitsky et al. |
| 5,472,888 | A | 12/1995 | Kinzer |
| 5,506,421 | A | 4/1996 | Palmour |
| 5,517,047 | A | 5/1996 | Linn et al. |
| 5,598,018 | A | 1/1997 | Lidow et al. |
| 5,726,469 | A | 3/1998 | Chen |
| 5,728,624 | A | 3/1998 | Linn et al. |
| 5,742,087 | A | 4/1998 | Lidow et al. |
| 5,744,852 | A | 4/1998 | Linn et al. |
| 5,744,994 | A | 4/1998 | Williams |
| 5,786,619 | A | 7/1998 | Kinzer |
| 5,849,627 | A * | 12/1998 | Linn et al. .................. 438/455 |
| 5,902,127 | A | 5/1999 | Park |
| 5,926,713 | A | 7/1999 | Hause et al. |
| 5,929,690 | A | 7/1999 | Williams |
| 5,939,754 | A | 8/1999 | Hoshi |
| 6,008,106 | A | 12/1999 | Tu et al. |
| 6,081,009 | A | 6/2000 | Neilson |
| 6,174,773 | B1 | 1/2001 | Fujishima |
| 6,184,555 | B1 | 2/2001 | Tihanyi et al. |
| 6,190,970 | B1 | 2/2001 | Liao et al. |
| 6,198,127 | B1 | 3/2001 | Kocon |
| 6,214,698 | B1 | 4/2001 | Liaw et al. |
| 6,222,229 | B1 | 4/2001 | Hebert et al. |
| 6,239,463 | B1 | 5/2001 | Williams et al. |
| 6,265,281 | B1 | 7/2001 | Reinberg |
| 6,291,856 | B1 | 9/2001 | Miyasaka et al. |
| 6,300,171 | B1 | 10/2001 | Frisina |
| 6,307,246 | B1 | 10/2001 | Nitta et al. |
| 6,310,365 | B1 | 10/2001 | Chen |
| 6,359,309 | B1 | 3/2002 | Liao et al. |
| 6,362,505 | B1 | 3/2002 | Tihanyi |
| 6,391,723 | B1 | 5/2002 | Frisina |
| 6,410,958 | B1 | 6/2002 | Usui et al. |
| 6,426,991 | B1 | 7/2002 | Mattson et al. |
| 6,452,230 | B1 | 9/2002 | Boden, Jr. |
| 6,459,124 | B1 | 10/2002 | Zhang et al. |
| 6,465,325 | B2 | 10/2002 | Ridley et al. |
| 6,495,421 | B2 | 12/2002 | Luo |
| 6,501,130 | B2 | 12/2002 | Disney |
| 6,501,146 | B1 | 12/2002 | Harada |
| 6,504,230 | B2 | 1/2003 | Deboy et al. |
| 6,509,220 | B2 | 1/2003 | Disney |
| 6,512,267 | B2 | 1/2003 | Kinzer et al. |
| 6,534,367 | B2 | 3/2003 | Peake et al. |
| 6,566,201 | B1 | 5/2003 | Blanchard |
| 6,613,644 | B2 | 9/2003 | Lachner |
| 6,624,494 | B2 | 9/2003 | Blanchard et al. |
| 6,635,906 | B1 | 10/2003 | Chen |
| 6,686,244 | B2 | 2/2004 | Blanchard |
| 6,710,400 | B2 | 3/2004 | Blanchard |
| 6,710,403 | B2 | 3/2004 | Sapp |
| 6,710,418 | B1 | 3/2004 | Sapp |
| 6,713,813 | B2 | 3/2004 | Marchant |
| 6,762,473 | B1 | 7/2004 | Goushcha et al. |
| 6,787,872 | B2 | 9/2004 | Kinzer et al. |
| 6,797,589 | B2 | 9/2004 | Adams et al. |
| 6,936,867 | B2 | 8/2005 | Chen |
| 6,936,907 | B2 | 8/2005 | Chen |
| 6,998,681 | B2 | 2/2006 | Chen |
| 7,015,104 | B1 | 3/2006 | Blanchard |
| 7,023,069 | B2 | 4/2006 | Blanchard |
| 7,041,560 | B2 | 5/2006 | Hshieh |
| 7,052,982 | B2 | 5/2006 | Hshieh et al. |
| 7,109,110 | B2 | 9/2006 | Hshieh |
| 2002/0070418 | A1 | 6/2002 | Kinzer et al. |
| 2005/0176192 | A1 | 8/2005 | Hshieh |

FOREIGN PATENT DOCUMENTS

| | | |
|---|---|---|
| WO | 2005031880 A1 | 4/2005 |

* cited by examiner

Note: Alternatively the
Device Wafer may be Oxidized
to Form the Buried Oxide

Thermally Oxidize Handle
Wafer to Form the BOx

Device Wafer Formation

Ion Implantation to Introduce
the Required Charge Balance Dose

Note: An Alternative
is to have an n-type
Wafer and Implant a
p-type Dopant

Polished, Flat, Clean,
Defect-free Surface

Perform High Temperature Anneal to:
A) Form Covalent Bonding Between the Device and Handle Wafers and
B) To Thermally Drive the Implanted Layer to the Required Thickness

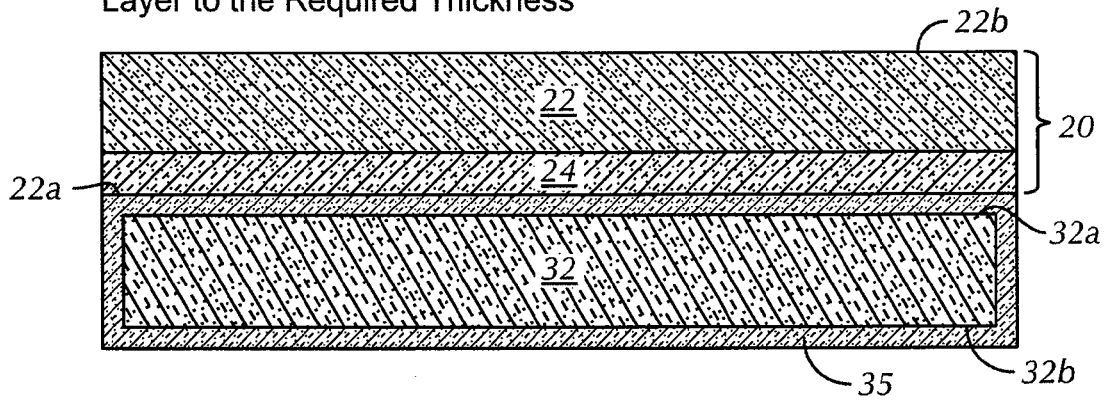

FIG. 1F

Grind and Polish Back the Top p-type Layer to the Required Thickness in Order to Achieve Charge Balance.

Result is a Charge Balanced Pn Stack Which may be Further Processed to Realize SJ Structures.

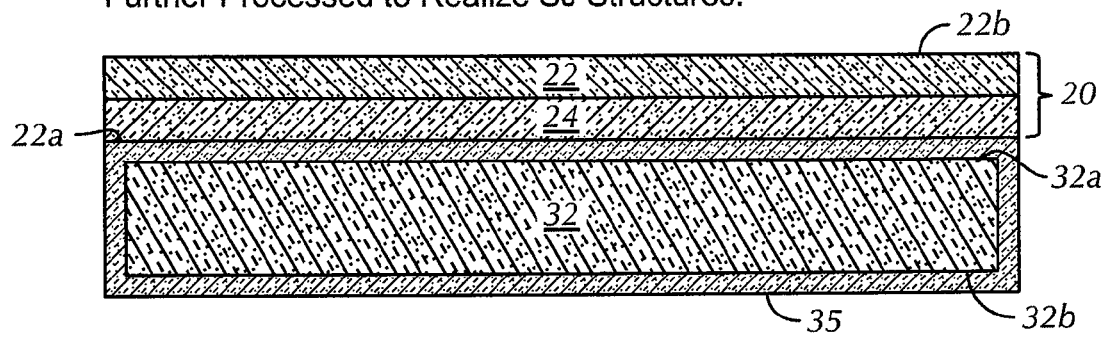

FIG. 1G

A Triple Layer Bonded Wafer Superjunction Device

SOI Handle Formation (In This Case, with a Thermal BOx)

Join Implanted Interface to Box Interface and High Temperature Anneal to Form Covalent Bonds and to Drive the Boron B Implanted Layer.

Thin Back n-type Layer to Thickness for Charge Balance

A Triple Layer Bonded Wafer Superjunction Device

A Triple Stack Of Alternate n-p-n or p-n-p Device Layers

Grinding And Polishing of the Uppermost Layer 224 to the Desired Thickness. The Doping and Thicknesses of the Various Layers are Chosen to Achieve Desired Charge Balance Thin the Si-Si Handle Wafer Back to the Required Thickness in Order to Achieve Charge Balance Thin Back n-type Layer to Thickness
Required for Charge Balance

High Temperature Boron B Drive

The SOI Wafer is Now Ready for Joining to the
Si-Si Bonded Wafer (see Below)

Form a Direct Bonded Silicon-silicon Wafer
in the same Manner as in the Previous Slide

Join the SOI Wafer to the Si-Si Wafer

Anneal to Form Covalent bonds Between the Wafers

Join the SOI Wafer to the Si-Si Wafer

Anneal to Form Covalent Bonds Between the Wafers

BONDED-WAFER SUPERJUNCTION SEMICONDUCTOR DEVICE

CROSS REFERENCE TO RELATED APPLICATIONS

This application claims the benefit of Provisional Patent Application No. 60/710,234 entitled "Bonded-Wafer Superjunction Semiconductor Device" filed on Aug. 22, 2005.

BACKGROUND OF THE INVENTION

Embodiments of the present invention generally relate to a bonded-wafer semiconductor device and a method for manufacturing a bonded-wafer semiconductor device, and more particularly, to a bonded-wafer superjunction semiconductor device having at least one trench and a method for manufacturing a bonded-wafer superjunction semiconductor device having at least one trench.

Silicon on insulator (SOI) semiconductors, dielectric isolation (DI) semiconductors and bonded-wafer semiconductor devices are generally known in the art. For example, basic known processes to bond semiconductor wafers include forming a layer of silicon dioxide on one silicon wafer, sometimes referred to as the "handle wafer," and placing the other wafer on the silicon dioxide and annealing (i.e., generally heating to and holding at a suitable temperature and then cooling at a suitable rate) the stacked wafers to form a bonded-wafer semiconductor device. The annealing/bonding process may include heating the stacked wafers in an annealing furnace for a number of minutes or hours. For example, the stacked wafers may be placed in an annealing furnace at 800-1200° C. for few a minutes to several hours to cause the materials to sufficiently bond. The annealing process may be performed in an inert ambient atmosphere, e.g., nitrogen gas, or in an oxidizing ambient atmosphere, e.g., pure oxygen, oxygen/nitrogen mixture, steam or the like. During a "wet" anneal, i.e., when steam is the ambient, the steam is generated using a mixture of oxygen and hydrogen typically above 800° C. Other known bonding methods include coating a silicon wafer with an oxide layer before placing another wafer on the oxide layer and then annealing the whole stack in a rapid thermal annealer for a few minutes at 800-1200° C.

Other known methods of bonding wafers to form SOI and DI devices include using a liquid oxidant or multiple layers of oxides and/or nitrides between the wafers prior to annealing. Additionally, other methods of bonding wafers to form SOI and DI devices include wetting the surfaces of the silicon wafers with a solution such as water ($H_2O$) and hydrogen peroxide ($H_2O_2$) and then pressing the wetted wafers together and drying them prior to annealing/bonding at 800-1200° C.

Still other known wafer bonding methods include bonding n-type semiconductor wafers to p-type semiconductor wafers to form a p-n junction. Plasma etches are used to remove impure oxides on the surfaces of the wafers to be bonded. The plasma etch resultantly leaves a thin polymer layer on the respective surfaces. For example, a carbon-fluorine-hydrogen ($CHF_3$) plasma may be used to etch the surfaces to be bonded. The surfaces are then de-oxidized and coated with a fluorocarbon polymeric layer which generally prevents further oxidation of the surface in air. The polymer coated surfaces are then pressed together and annealed at about 800-1300° C. for 4-6 hours. The elevated temperature drives off the fluorine and the hydrogen leaving the carbon, and thereby forming a bond.

There are generally two types of wafer joining methods prior to annealing, namely, hydrophilic joining and hydrophobic joining. In hydrophilic joining, the surfaces to be joined are cleaned using a method that results in the surfaces being hydrophilic such that the exposed silicon atoms on the bare silicon surface are terminated with hydroxyl (—OH) groups. Once joined, the hydroxyl groups on both surfaces attract each other by hydrogen bonding. In hydrophobic bonding, the cleaning step before joining employs hydrofluoric acid. After the cleaning, the exposed silicon atoms with dangling bonds are terminated with fluorine atoms. The fluorine atoms contribute, in part, to the pre-anneal joining force. During the annealing, the fluorine is generally driven from the joined surface.

It is desirable to provide a bonded-wafer semiconductor device and a method for manufacturing a bonded-wafer semiconductor device. It is also desirable to provide a multi-layer silicon-silicon bonded-wafer semiconductor device and a method for manufacturing a multi-layer silicon-silicon bonded-wafer semiconductor device. Further, it is desirable to provide a multi-layer bonded-wafer semiconductor device having at least one trench and a method for manufacturing a multi-layer bonded-wafer semiconductor device having at least one trench. Even further, it is desirable to provide a multi-layer bonded-wafer superjunction lateral Schottky device and a method of manufacturing a multi-layer bonded-wafer superjunction lateral Schottky device.

BRIEF SUMMARY OF THE INVENTION

Briefly stated, an embodiment of the present invention relates to a bonded-wafer semiconductor device that includes a semiconductor substrate having first and second main surfaces opposite to each other, a buried oxide layer disposed on at least a portion of the first main surface of the semiconductor substrate and a multi-layer device stack having a first main surface and a second main surface. The multi-layer device stack includes a first device layer of a first conductivity disposed on the buried oxide layer, a second device layer of a second conductivity opposite to the first conductivity disposed on the first device layer, a third device layer of the first conductivity disposed on the second device layer and a fourth device layer of the second conductivity disposed on the third device layer. A trench is formed in the first main surface of the multi-layer device stack. The trench extends to a first depth position in the multi-layer device stack. A mesa proximate the first main surface of the multi-layer device stack is defined by the trench. The mesa has a first sidewall and a second sidewall opposite the first sidewall. A first anode/cathode layer is disposed on a first sidewall of the multi-layer device stack, and a second anode/cathode layer is disposed on the second sidewall of the multi-layer device stack.

Another embodiment of present invention relates to a method of manufacturing a bonded-wafer semiconductor device that includes providing a first semiconductor substrate having first and second main surfaces opposite to each other and depositing an oxide layer on the first main surface of the first semiconductor substrate. A second semiconductor substrate having first and second main surfaces opposite to each other is provided. The second semiconductor substrate is of a first conductivity. The first main surface of the second semiconductor substrate is doped with a first dopant of a second conductivity opposite to the first conductivity. The doped first main surface of the second semiconductor substrate is placed onto the oxide layer on the first main surface of the first semiconductor substrate. The second semiconductor substrate is annealed (bonded) to the oxide layer thereby diffusing the first dopant into the second semiconductor substrate to create a first device layer of the second conductivity and a second device layer of the first conductivity. The second main surface of the second semiconductor substrate is doped with a second dopant of the second conductivity. The second dopant is diffused into the second semiconductor substrate to form a third device layer of the second conductivity.

Another embodiment of present invention relates to a method of manufacturing a bonded-wafer semiconductor device that includes providing a first semiconductor substrate having first and second main surfaces opposite to each other and depositing an oxide layer on the first main surface of the first semiconductor substrate. A second semiconductor substrate having first and second main surfaces opposite to each other is provided. The second semiconductor substrate is of a first conductivity. The first main surface of the second semiconductor substrate is placed onto the oxide layer on the first main surface of the first semiconductor substrate. The second semiconductor substrate is annealed (bonded) to the oxide layer to create a first device layer of the first conductivity. A third semiconductor substrate having first and second main surfaces opposite to each other is provided. The third semiconductor substrate is of the second conductivity. The first main surface of the third semiconductor substrate is placed onto the second main surface of second semiconductor substrate. The third semiconductor substrate is annealed (bonded) to the second semiconductor substrate to create a second device layer of the first conductivity.

BRIEF DESCRIPTION OF THE SEVERAL VIEWS OF THE DRAWINGS

The foregoing summary, as well as the following detailed description of various embodiments of the invention, will be better understood when read in conjunction with the appended drawings. For the purpose of illustrating various embodiments of the invention, there are shown in the drawings embodiments which are presently preferred. It should be understood, however, that the invention is not limited to the precise arrangements and instrumentalities shown. In the drawings:

FIG. 1F is a partial cross-sectional side elevational view of the device wafer of FIG. 1C being bonded to the handle wafer of FIG. 1B;

FIG. 1G is a partial cross-sectional side elevational view of the bonded-wafers of FIG. 1F being ground and polished;

DETAILED DESCRIPTION OF THE INVENTION

Figure 1:
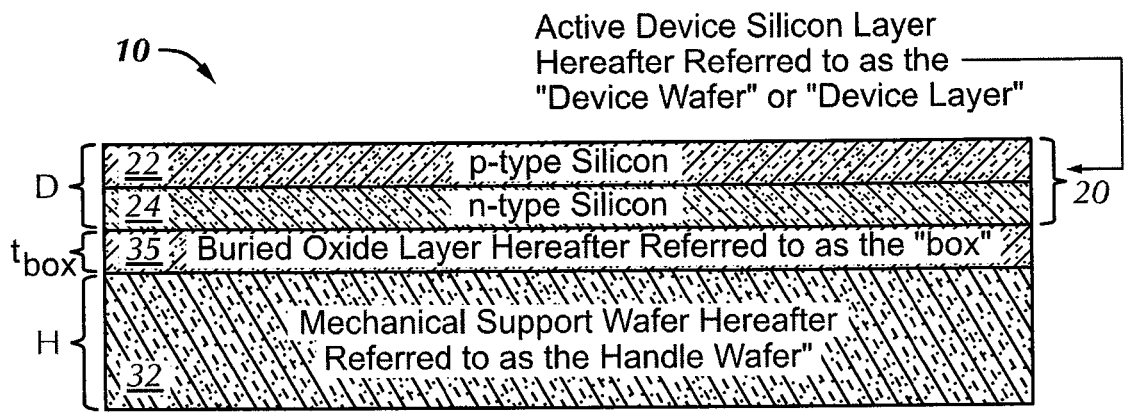
FIG. 1 is a partial cross-sectional side elevational view of a double-layer bonded-wafer superjunction device in accordance with a first preferred embodiment of the present invention.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a" as used in the claims and in the corresponding portion of the specification, means "at least one."

Although an embodiment of the present invention may refer to a particular conductivity (e.g., p-type or n-type), it will be readily understood by those skilled in the art that p-type conductivity can be switched with n-type conductivity and the device would still be functionally correct (i.e., a first or a second conductivity type). Therefore, where used herein, the reference to n-type may be interchangeable with p-type and reference to p-type may be interchangeable with n-type.

Furthermore, n$^+$ and p$^+$ refer to heavily doped n and p regions, respectively; n$^{++}$ and p$^{++}$ refer to very heavily doped n and p regions, respectively; n$^-$ and p$^-$ refer to lightly doped n and p regions, respectively; and n$^{--}$ and p$^{--}$ refer to very lightly doped n and p regions, respectively. However, such relative doping terms should not be construed as limiting.

Referring to the drawings in detail, wherein like numerals reference indicate like elements throughout, there is shown in FIG. 1 a double-layer bonded-wafer superjunction device 10 in accordance with a first preferred embodiment of the present invention. The bonded-wafer superjunction device 10 includes a mechanical support wafer or "handle wafer" 32, a buried oxide layer or BOx layer 35, a first active layer 24 and a second active layer 22. The handle layer 32 has a thickness H of several hundred micrometers or microns (μm), e.g., a thickness H of about 550 μm. The BOx layer 35 has a thickness $t_{BOx}$ of about 0.5-3.0 μm. The first and second active layers 24, 22 have a collective thickness D of several microns, e.g., a thickness D of 6 μm.

FIGS. 1A-1G show steps for forming the double-layer bonded-wafer superjunction device 10 of FIG. 1.

Figure 1A:
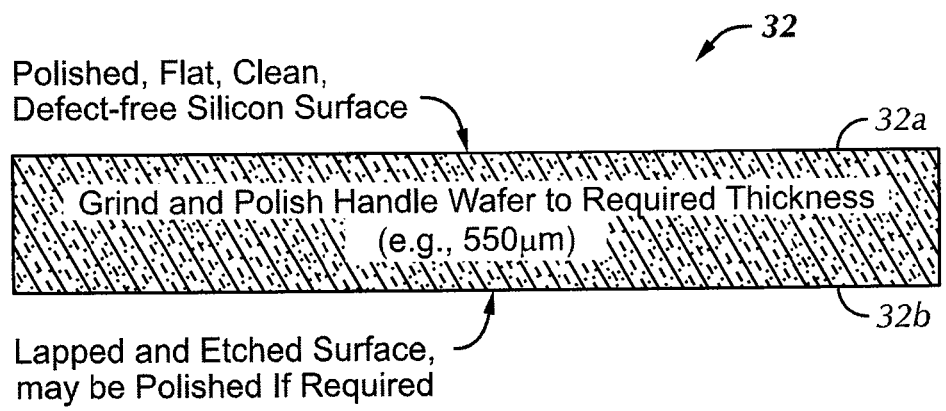
FIG. 1A is a partial cross-sectional side elevational view of a handle wafer for forming the bonded-wafer superjunction device of FIG. 1.

FIG. 1A shows the handle wafer 32 for forming the bonded-wafer superjunction device of FIG. 1. Preferably, the handle wafer 32 is formed of silicon. The handle wafer 32 has a first main surface 32a and a second main surface 32b. The first main surface 32a is ground and/or polished flat using known processes, such as mechanical or chemical grinding, etching and/or polishing processes. Preferably, the first main surface 32a is ground and/or polished sufficiently to leave a polished, flat, clean surface, which is ideally defect-free surface. The second main surface 32b may be lapped and etched using a known lapping and/or etching process. Optionally, the second main surface 32b may be ground and/or polished too.

Figure 1B:
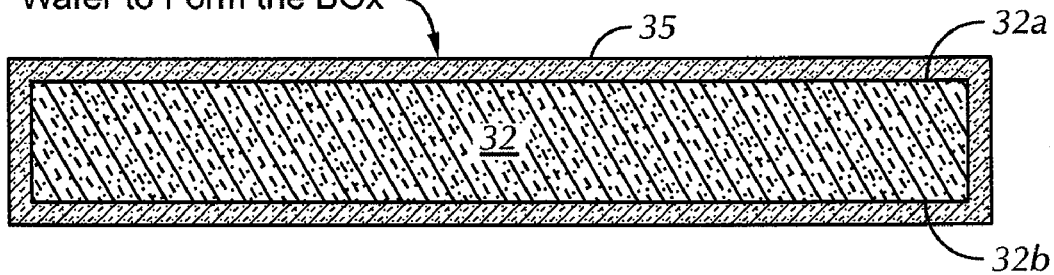
FIG. 1B is a partial cross-sectional side elevational view of the handle wafer of FIG. 1A after thermal oxidation.

The handle wafer 32 is then oxidized to form a buried oxide BOx layer 35 as shown in FIG. 1B. The BOx layer 35 is applied using one of thermal growth, low pressure (LP) chemical vapor deposition (CVD), plasma enhanced chemical vapor deposition (PECVD), atmospheric pressure chemical vapor deposition (APCVD), and deposition. The BOx layer 35 is preferably an oxide. Alternatively, the BOx layer 35 may be a nitride, silicon-oxynitride or the like.

Figure 1C:
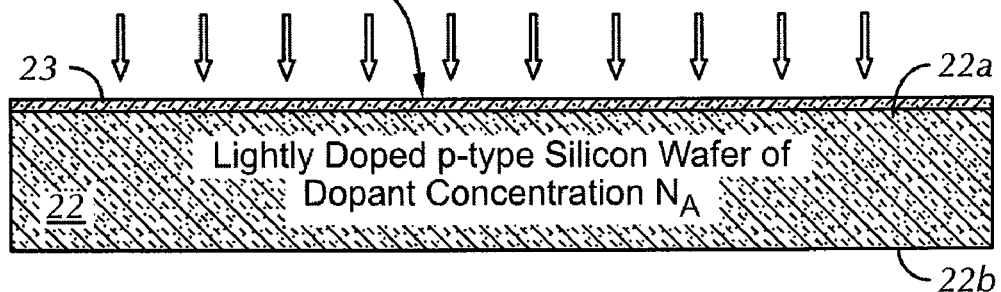
FIG. 1C is a partial cross-sectional side elevational view of a device wafer for forming the bonded-wafer superjunction device of FIG. 1.

FIG. 1C shows a device wafer 22 for forming the bonded-wafer superjunction device 10 of FIG. 1. The device wafer 22 has a first main surface 22a and a second main surface 22b. The device wafer 22 is preferably a lightly doped p-type silicon wafer having a doping concentration of $N_A$. At least the first main surface 22a of the device wafer 22 is then ground and/or polished flat using known mechanical or chemical grinding, etching and/or polishing processes. Preferably, the first main surface 22a is ground and/or polished sufficiently to leave a polished, flat, clean nearly defect-free surface. The first main surface 22a of the device wafer 22 is then ion implanted to introduce a desired charge balance dose. For a p-type silicon wafer, the ion implant is preferably n-type type (e.g., doping with phosphorus P or arsenic As results in a more n-type region). Alternately, the device wafer 22 may be n-type (e.g., doping with boron B results in a more p-type region). Other dopants may be utilized such as antimony Sb, bismuth Bi, aluminum Al, indium In, gallium Ga and the like depending on the material of the device wafer 22 and the desired strength of the doping. Preferably, the energy level for the ion implantation is in the range of about 200 to 1000 KeV, but it should be recognized that the energy level should be selected to sufficiently implant the dopant. The ion implant creates a doped region 23, in the present case, an n-type doped region 23.

Figure 1D:
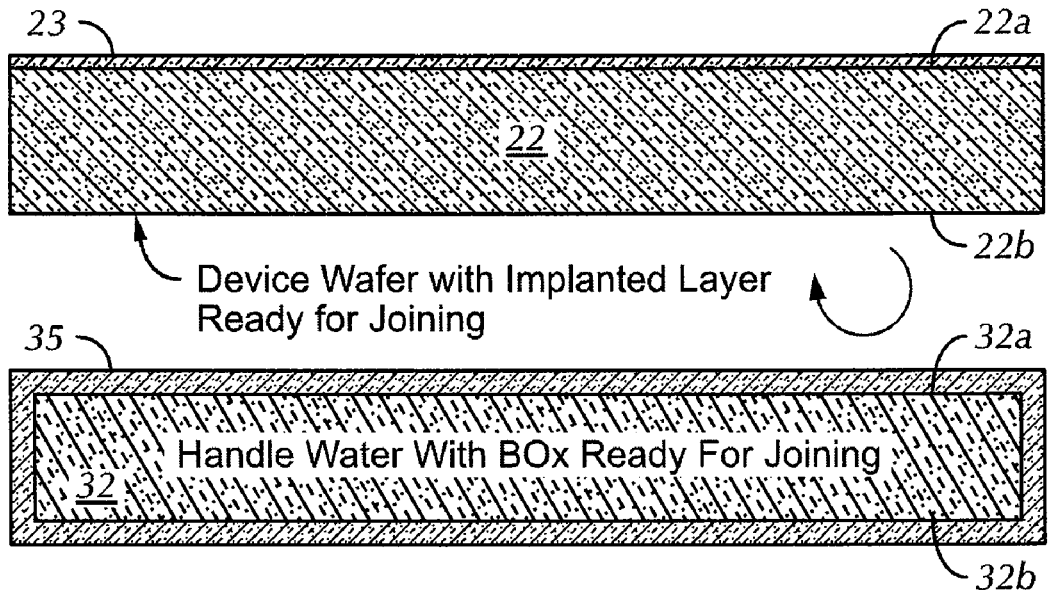
FIG. 1D is a partial cross-sectional side elevational view of the device wafer of FIG. 1C being arranged to be bonded to the handle wafer of FIG. 1B.
Figure 1E:
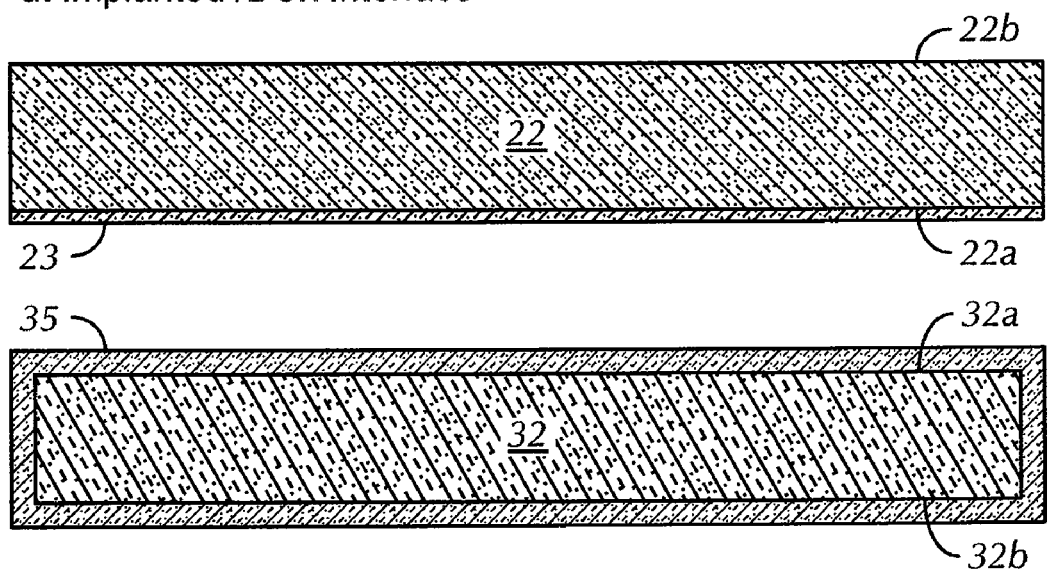
FIG. 1E is a partial cross-sectional side elevational view of the device wafer of FIG. 1C ready to be bonded to the handle wafer of FIG. 1B.

FIG. 1D shows the device wafer 22 being arranged to be bonded to the handle wafer 32. The first main surface 22a of the device wafer 22 is rotated to face the first main surface 32a of the handle wafer 32. FIG. 1E shows the device wafer 22 ready to be bonded to the handle wafer 32. In FIG. 1F, the first main surface 22a of the device wafer 22 is pushed against the BOx layer 35 covering first main surface 32a of the handle wafer 32. The device wafer 22 and handle wafer 32 are then subjected to a high temperature annealing process to form a covalent bond between the device wafer 32 and the handle wafer 32 and to thermally drive the implanted layer 23 into the device wafer 22 to thereby create an n-type layer 24. FIG. 1G is a partial cross-sectional side elevational view of the bonded-wafers of FIG. 1F having the uppermost device layer (p-type layer) 22 ground and polished to a size sufficient to achieve the desired charge balance between the uppermost device layer (p-type layer) 22 and the lowermost device layer (n-type layer) 24. Generally, semiconductor wafers 20, 32 are coarsely thinned by a grinding machine having a rough grinding wheel or grinding pad such as a diamond or carbide grinding wheel or pad having, for example, diamond impregnated resin teeth. Other grinding techniques may also be utilized. Grinding the wafer also allows for thinner, and therefore smaller integrated circuits (ICs) to be manufactured. Generally, polishing is a finer process using a wet silica-particle slurry which is washed across the surface of the semiconductor wafer 20, 32 at a predetermined flow rate and is referred to as chemical mechanical polishing (CMP). Optionally, the surface of the semiconductor wafer 20, 32 is thinned by grinding and is then polished.

Figure 2:
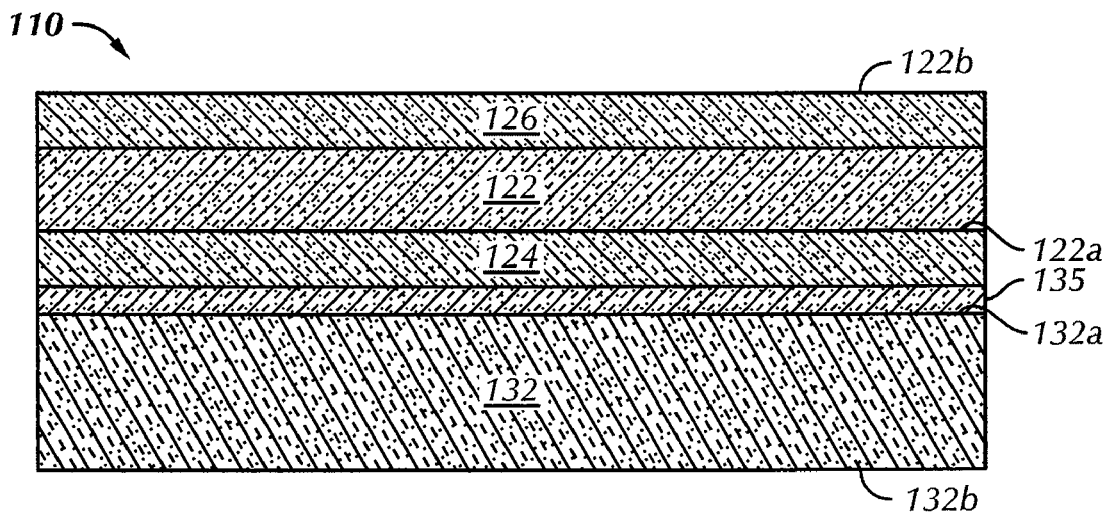
FIG. 2 is a partial cross-sectional side elevational view of a triple-layer bonded-wafer superjunction device in accordance with a second preferred embodiment of the present invention.

FIG. 2 is a partial cross-sectional side elevational view of a triple-layer bonded-wafer device 110 in accordance with a second preferred embodiment of the present invention. FIGS. 2A-2D depict the processing steps to form the triple-layer bonded-wafer device 110 of FIG. 2.

Figure 2A:
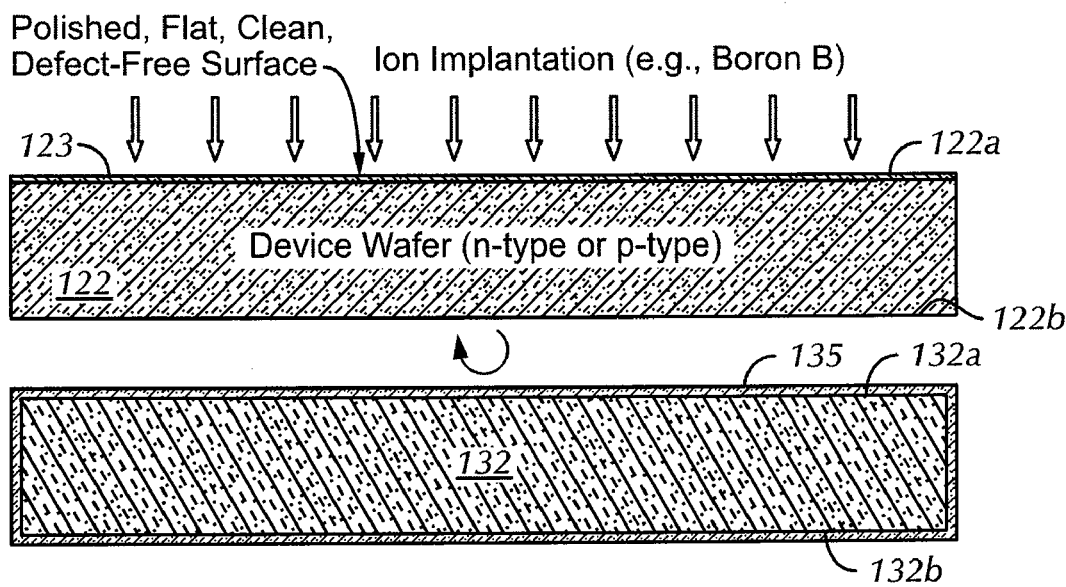
FIG. 2A is a partial cross-sectional side elevational view of a handle wafer and a device wafer for forming the bonded-wafer superjunction device of FIG. 2 where the device wafer is being doped.

Referring to FIG. 2A, a handle wafer 132 has a first main surface 132a and a second main surface 132b. The handle wafer 132 has been coated with a BOx layer 135 similar to the first preferred embodiment. A device wafer 122 has a first main surface 122a and a second main surface 122b. The device wafer 122 is of a first conductivity such as n-type or p-type. The device wafer 122 is smoothed or polished using a process such as CMP to create a flat, clean and preferably nearly defect-free surface. The first main surface 122a of the device wafer 122 is doped by ion implantation. Other forms of doping can be utilized without departing from embodiments of the invention. However, by using ion implantation, the doping can be more narrowly and controllably directed to a particular surface of the device wafer 122. The doping results in a first doped region 123 proximate the first main surface 122a that is of a second conductivity different than the first conductivity such as the other of n-type or p-type. For example, if the device wafer 122 is n-type, then the first main surface 122a is implanted with a p-type dopant such as boron; and if the device wafer 122 is p-type, then the first main surface 122a is implanted with an n-type dopant such as phosphorous.

Figure 2B:
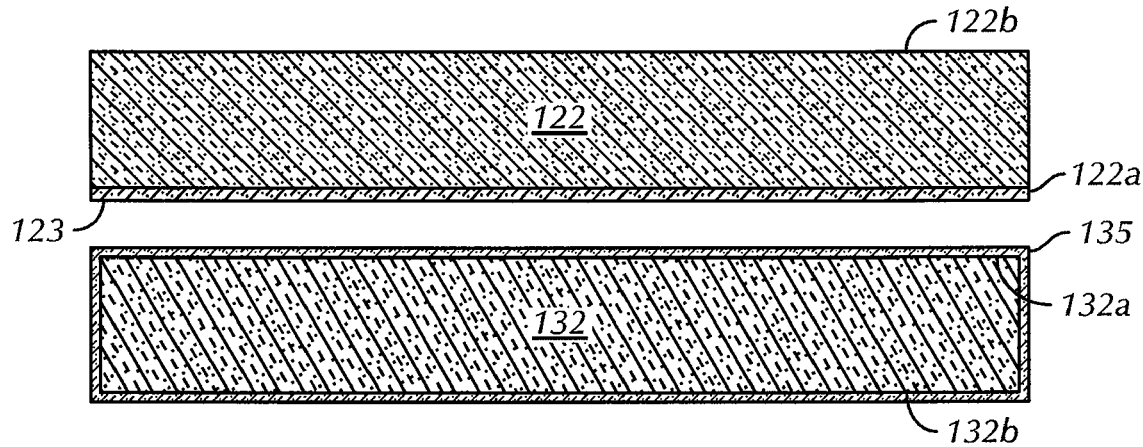
FIG. 2B is a partial cross-sectional side elevational view of the device wafer of FIG. 2A about to be bonded to the oxide-covered handle wafer of FIG. 2A.
Figure 2C:
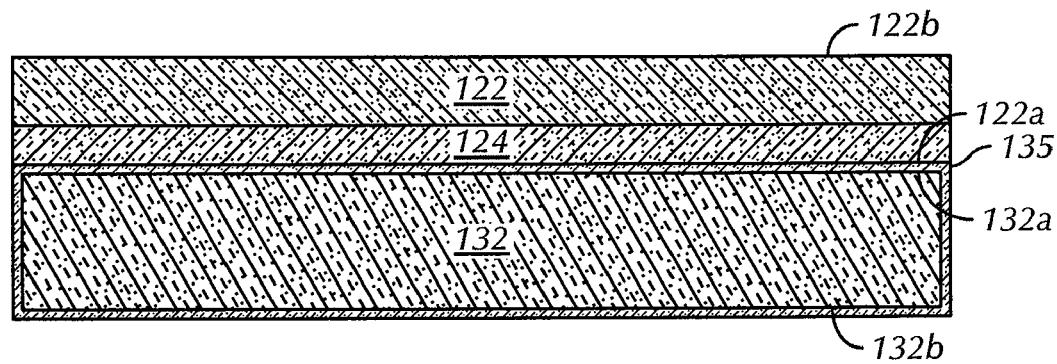
FIG. 2C is a partial cross-sectional side elevational view of a double-layer bonded-wafer device formed by annealing/bonding the devices of FIG. 2B and the double-layer bonded-wafer being ground and polished.

The device wafer 122 is then reoriented so that the implanted first main surface 122a is aligned with and placed on the BOx layer 135 covering the first main surface 132a of the handle wafer 132. FIG. 2B shows the device wafer 122 about to be bonded to the oxide layer 135 of the handle wafer 132. The device wafer 122 and the oxide-covered handle wafer 132 are then annealed (i.e., heated to join) to form covalent bonds between the oxide layer 135 and the doped region 123 and to drive the dopant into the device wafer 122 thereby creating a second layer 124 of the second conductivity as shown in FIG. 2C. The annealing/bonding cycle may be, for example, at a temperature of about 700°-1200° C. for a few minutes to several hours. The longer the annealing/bonding (heating) cycle, the more the dopants will diffuse into the device wafer 122, so the heating time is selected to achieve the desired diffusion depth.

Figure 2D:
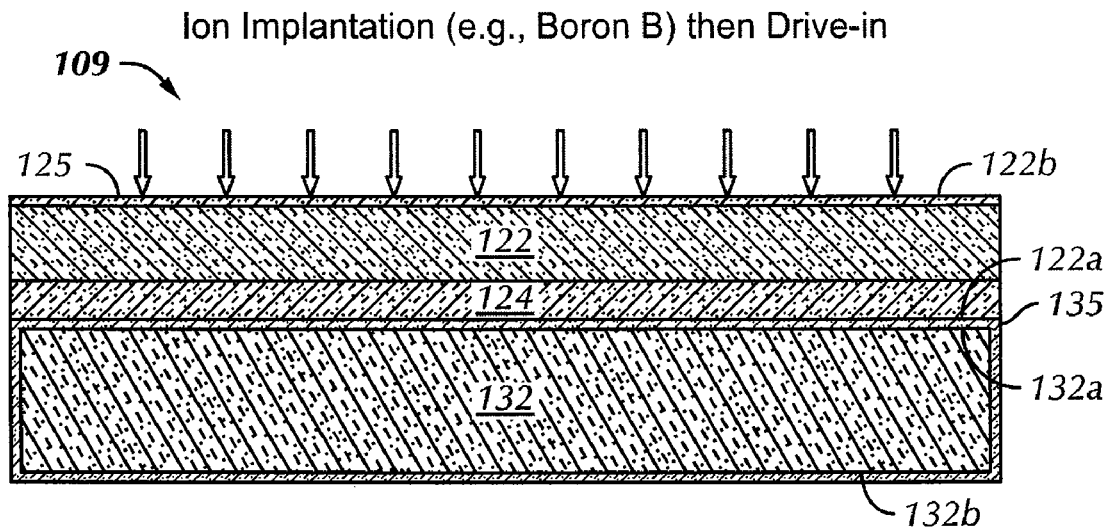
FIG. 2D is a partial cross-sectional side elevational view of the double-layer bonded-wafer device of FIG. 2C being doped.

The second main surface 122b of the device wafer 122 is then ground and polished to a desired thickness prior to a second doping step. FIG. 2D shows the second main surface 122b of the device wafer 122 being doped by ion implantation. The doping results in a second doped region 125 proximate the second main surface 122b that is of a second conductivity different than the first conductivity such as the other of n-type or p-type. For example, if the device wafer 122 is n-type, then the second main surface 122b is implanted with a p-type dopant such as boron; and if the device wafer 122 is p-type, then the second main surface 122b is implanted with an n-type dopant such as phosphorous. The intermediate multi-layer device 109 is then subjected to another heating cycle to drive the dopant into the device wafer 122 thereby converting the second doped region 125 into a third device layer 126 and creating the triple-layer bonded-wafer device 110 of FIG. 2. The heating cycle may be, for example, at a temperature of about 700°-1200° C. for a few minutes to several hours. The longer the drive-in heating cycle, the more the dopants will diffuse into the device wafer 122, so the heating time is selected to achieve the desired diffusion depth.

The triple-layer bonded-wafer device 110 comprises alternating conductivity device layers 126, 122, 124 such as n-p-n or p-n-p. The n-p-n/p-n-p device layers 126, 122, 124 can be used to form IC's by etching trenches (not shown), doping regions, adding contacts and the like as is known in the art. The buried oxide or BOx layer 135 over the handle wafer 132 provides a mechanical support structure. The BOx layer 135 provides an etch-stop for further work and an insulating layer that reduces cross-talk between circuits formed in the n-p-n/p-n-p device layers 126, 122, 124. Additional n-p-n/p-n-p layers 126, 122, 124 can also be bonded to the uppermost device layer 126 to form additional multi-layer bonded-wafer devices 110.

Figure 3:
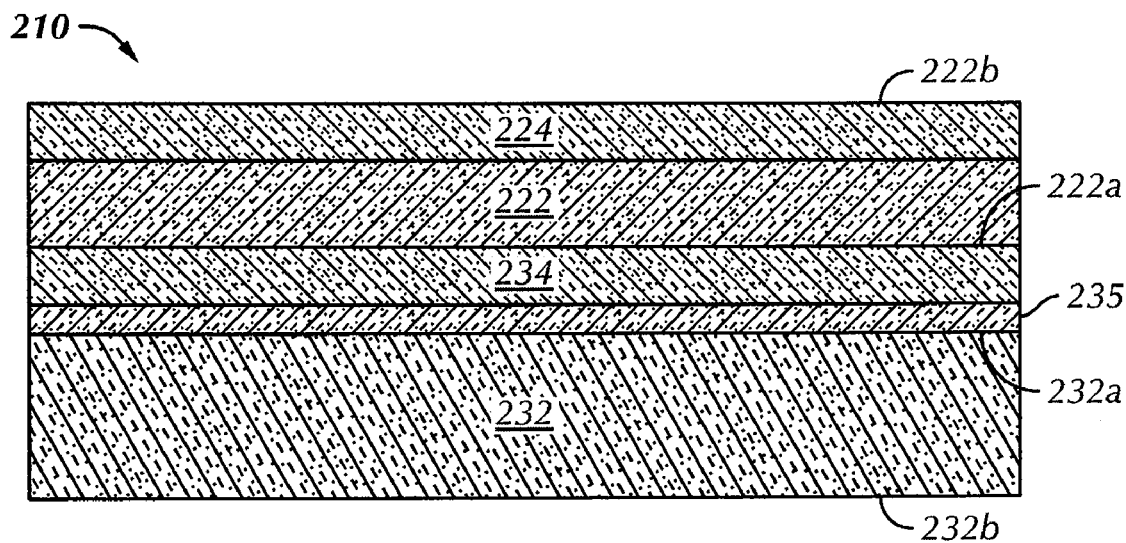
FIG. 3 is a partial cross-sectional side elevational view of a triple-layer bonded-wafer superjunction device in accordance with a third preferred embodiment of the present invention.
Figure 3A:
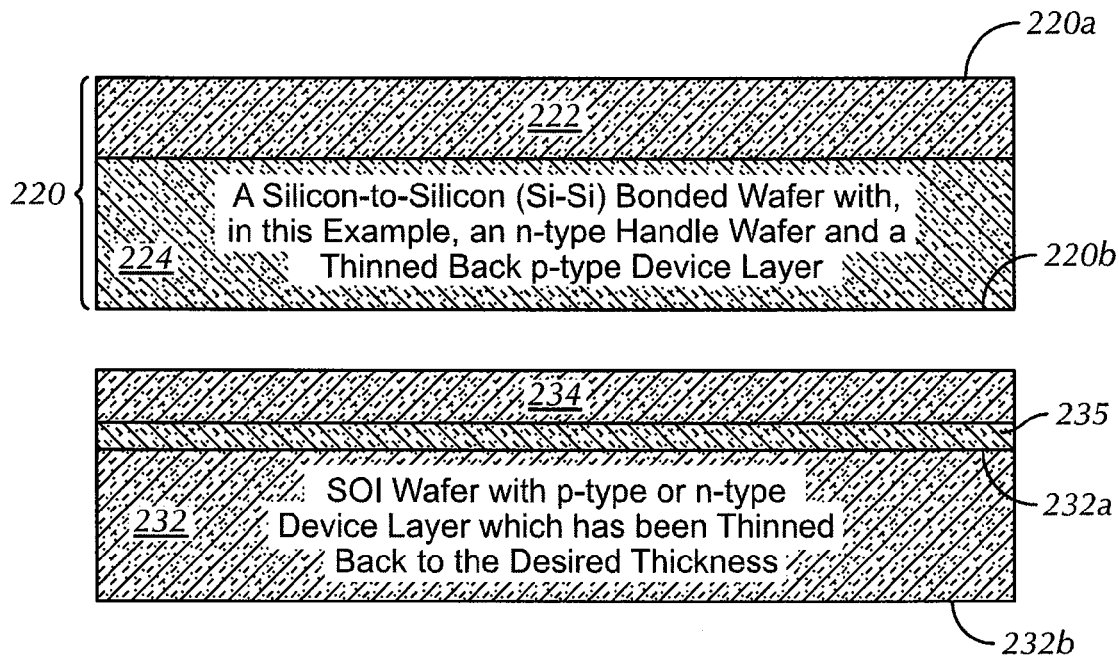
FIG. 3A is a partial cross-sectional side elevational view of a double-layer device wafer before being bonded to a single active layer handle wafer in accordance with the second preferred embodiment of the present invention.
Figure 3B:
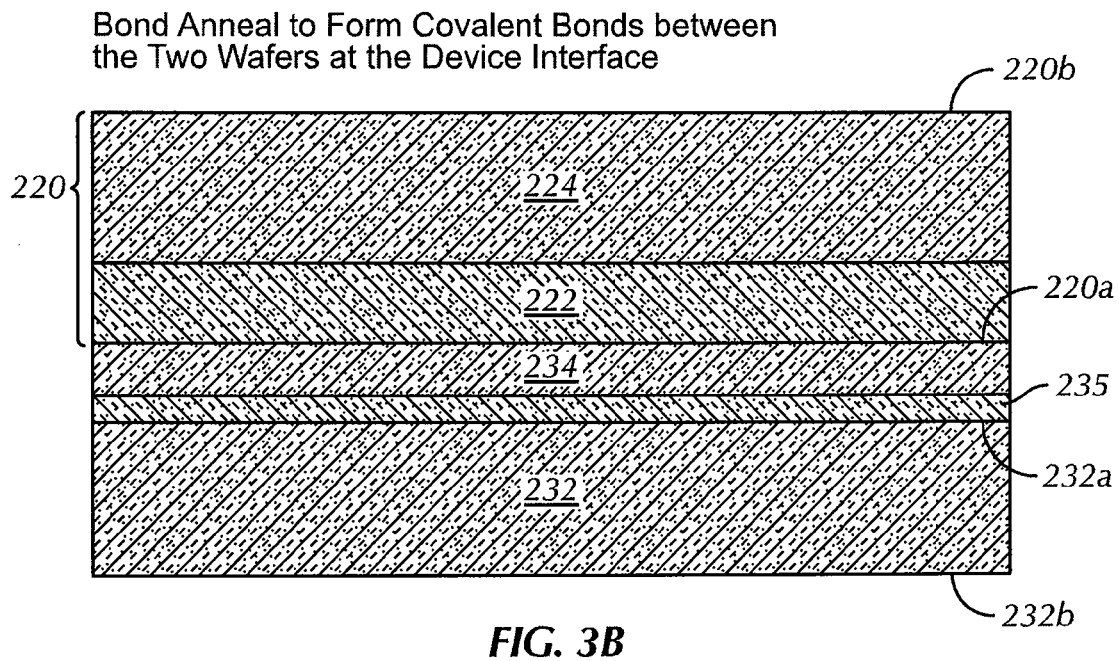
FIG. 3B is a partial cross-sectional side elevational view of the double-layer device wafer of FIG. 3A being bonded to the single active layer handle wafer of FIG. 3A.
Figure 3C:
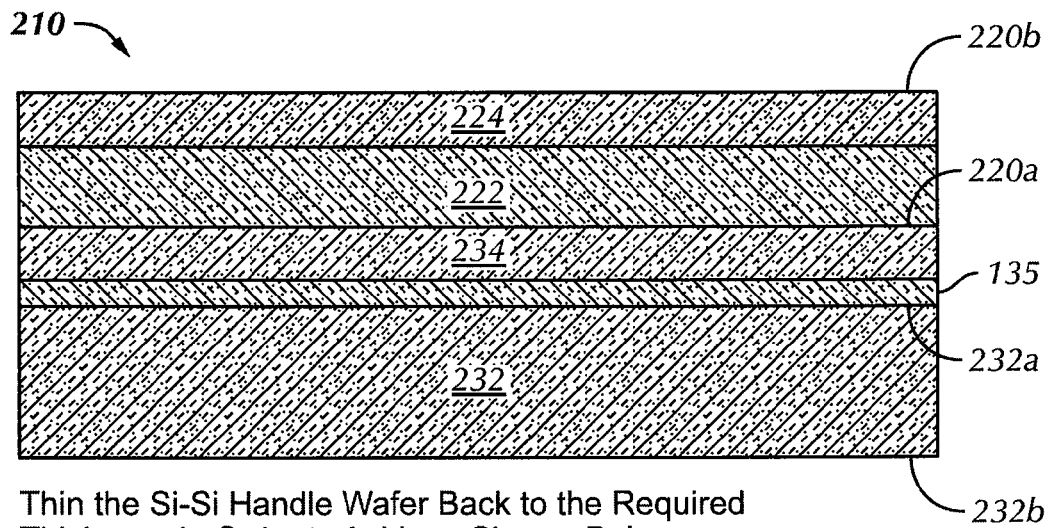
FIG. 3C is a partial cross-sectional side elevational view of a triple-layer bonded-wafer superjunction device being ground and polished.

FIG. 3 is a partial cross-sectional side elevational view of a triple-layer bonded-wafer superjunction device in accordance with a third preferred embodiment of the present invention. FIGS. 3A-3C depict the processing steps to form the triple-layer bonded-wafer device 210 of FIG. 3.

FIG. 3A shows a double-layer device wafer 220 before being bonded to a single-active layer 234 on a buried oxide BOx layer 235 and a handle wafer 232. The double-layer device wafer 220 can be formed by silicon-silicon bonding so that the double-layer device wafer can be formed in parallel to the handle wafer 232 to save processing steps. However, the double-layer device wafer 220 can also be formed by implanting and annealing and/or by epitaxial growth without departing from embodiments of the present invention. The handle wafer 232 has a first main surface 232a and a second main surface 232b. At least the first main surface 232a of the handle wafer 232 is lined with the BOx layer 235. A single or multi-layered active layer 234 is bonded to the BOx layer 235 proximate the first main surface 232a of the handle wafer 232 in a process similar to that shown in FIGS. 1A-1G, with or without the doping step as desired. In this example, a single device layer 234 of a first conductivity is bonded to the BOx layer 235 without doping. The exposed surface 234a of the single device layer 234 is polished using a process such as CMP to create a flat, clean and preferably nearly defect-free surface.

The device wafer 220 has a first main surface 220a and a second main surface 220b. The device wafer 220 includes a first device layer 222 of a second conductivity opposite the first conductivity such as the other of n-type or p-type and a second device layer 224 of the first conductivity. The first main surface 220a of the device wafer 220 is polished using a process such as CMP to create a flat, clean and preferably nearly defect-free surface. The double-layer device wafer 220 is then arranged to be bonded to the single active layer 234 and handle wafer 232.

FIG. 3B shows the double-layer device wafer 220 being bonded by an annealing/bonding cycle to the single active layer 234 on the handle wafer 232 by silicon-to-silicon bonding (Si—Si). The annealing/bonding cycle may be, for example, at a temperature of about 700°-1200° C. for a few minutes to several hours. It should be noted that for a given annealing temperature, the annealing time will vary the diffusion depth and vice versa. Accordingly, the annealing process may be controlled by varying the time and/or temperature to achieve the desired diffusion depth and sufficient bonding. FIG. 3C shows the triple-layer bonded-wafer device 210 after the uppermost layer 224 is ground and polished. The doping and thickness of the various layers 222, 224, 234 are chosen to achieve the desired charge balance. Similarly, the handle wafer 232 may also be ground and polished (i.e., thinned) to affect the overall charge balance in a similar manner.

Similar to the second preferred embodiment, the triple-layer bonded-wafer device 210 ultimately comprises alternating conductivity device layers 224, 222, 234 such as n-p-n or p-n-p. The n-p-n/p-n-p device layers 224, 222, 234 can be used to form IC's by etching trenches (not shown), doping regions, adding contacts and the like as is known in the art. The buried oxide or BOx layer 235 over the handle wafer 232 provides a mechanical support structure. The BOx layer 235 provides an etch-stop for further work and an insulating layer that reduces cross-talk between circuits formed in the n-p-n/p-n-p device layers 224, 222, 234. Additional n-p-n/p-n-p layers 224, 222, 234 can also be bonded to the uppermost device layer 224 to form additional multi-layer bonded-wafer devices 210 in a similar fashion.

Figure 4:
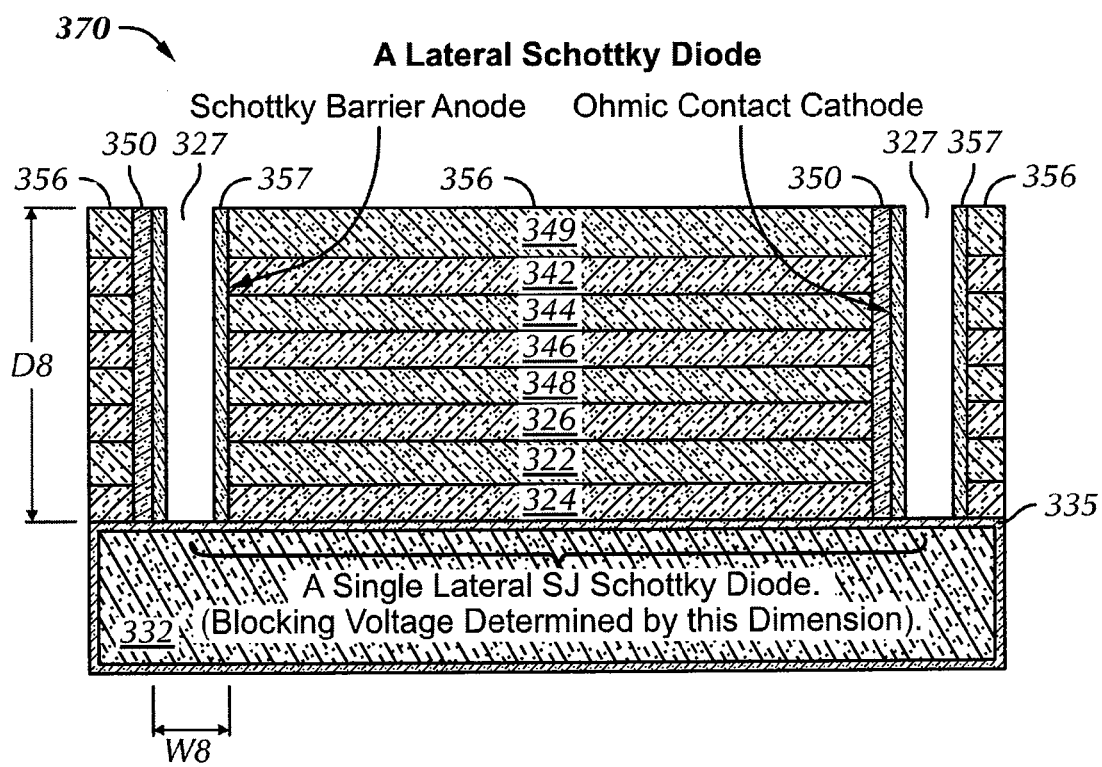
FIG. 4 is a partial cross-sectional side elevational view of an octad-layer bonded-wafer superjunction device in accordance with a fourth preferred embodiment of the present invention with elements forming a lateral superjunction Schottky diode.
Figure 4A:
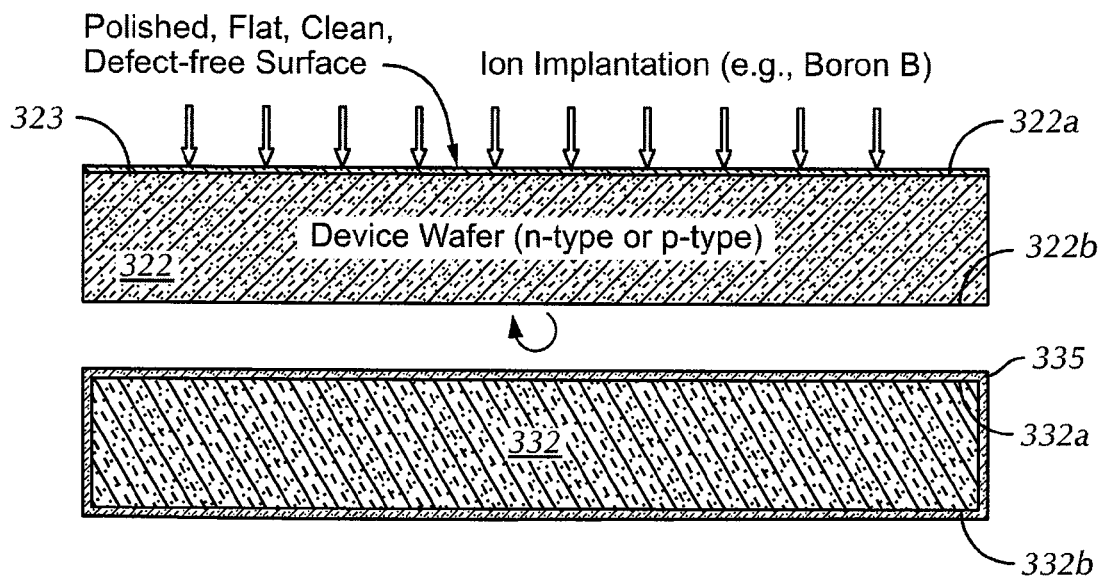
FIG. 4A is a partial cross-sectional side elevational view of a handle wafer and a device wafer for forming the octad-layer bonded-wafer superjunction device of FIG. 4 where the device wafer is being doped.

FIG. 4 is a partial cross-sectional side elevational view of an octad-layer bonded-wafer superjunction device 370 in accordance with a fourth preferred embodiment of the present invention with elements forming a lateral superjunction Schottky diode. FIGS. 4A-4P depict the processing steps to form the octad-layer bonded-wafer device 370 of FIG. 4.

FIG. 4A illustrates a handle wafer 332 having a buried oxide layer BOx 335 thereon. The handle wafer 332 has a first major surface 332a and a second major surface 332b. A device wafer 322 has a first major surface 322a and a second major surface 322b. The device wafer 322 is of a first conductivity such as n-type or p-type. The device wafer 322 is polished using a process such as CMP to create a flat, clean and preferably nearly defect-free surface. The first main surface 322a of the device wafer 322 is doped with a dopant by ion implantation. Other forms of doping can be utilized without departing from embodiments of the invention. However, by using ion implantation, the doping can be more narrowly and controllably directed to a particular surface of the device wafer 322. The doping results in a first doped region 323 proximate the first main surface 322a that is of a second conductivity different than the first conductivity such as the other of n-type or p-type. For example, if the device wafer 322 is n-type, then the first main surface 122a is implanted with a p-type dopant such as boron; and if the device wafer 322 is p-type, then the first main surface 322a is implanted with an n-type dopant such as phosphorous.

Figure 4B:
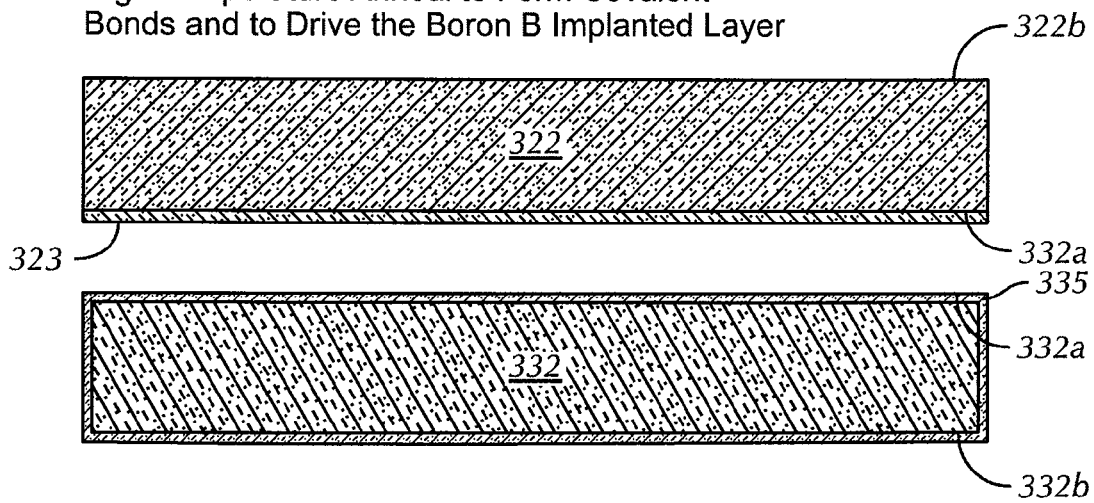
FIG. 4B is a partial cross-sectional side elevational view of the device wafer of FIG. 4A about to be bonded to the oxide-covered handle wafer of FIG. 4A.
Figure 4C:
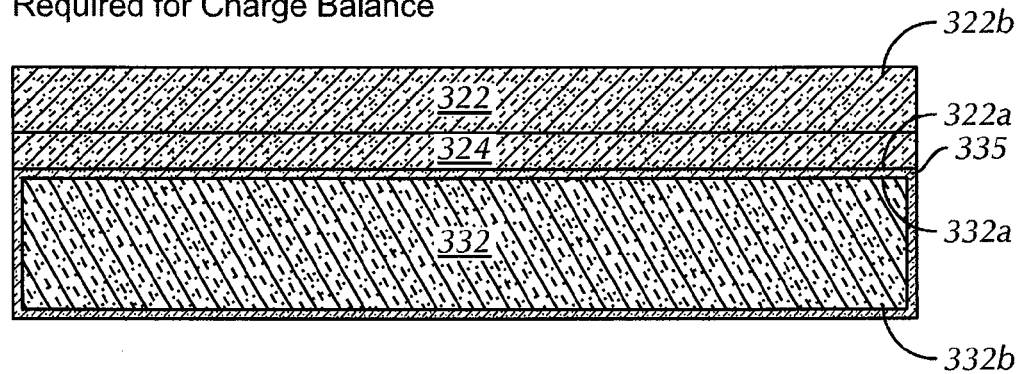
FIG. 4C is a partial cross-sectional side elevational view of a double-layer bonded-wafer device formed by annealing/bonding the devices of FIG. 4B and the double-layer bonded-wafer being ground and polished.

FIG. 4B shows that the device wafer 322 is then reoriented so that the implanted first main surface 322a is aligned with and placed on the BOx layer 335 covering the first main surface 332a of the handle wafer 332. FIG. 4B shows the device wafer 322 about to be bonded to the oxide layer 335 of the handle wafer 332. The device wafer 322 and the oxide-covered handle wafer 332 are then annealed (i.e., heated to join) to form covalent bonds between the oxide layer 335 and the doped region 323 and to drive the implanted dopant into the device wafer 322 thereby creating a second layer 324 of the second conductivity as shown in FIG. 4C. The annealing/bonding cycle may be, for example, at a temperature of about 700°-1200° C. for a few minutes to several hours. The longer the annealing/bonding (heating) cycle, the more the dopants will diffuse into the device wafer 322, so the heating time is selected to achieve the desired diffusion depth. It should be noted that for a given annealing temperature, the annealing time will vary the diffusion depth and vice versa. Accordingly, the annealing process may be controlled by varying the time and/or temperature to achieve the desired diffusion depth and sufficient bonding.

Figure 4D:
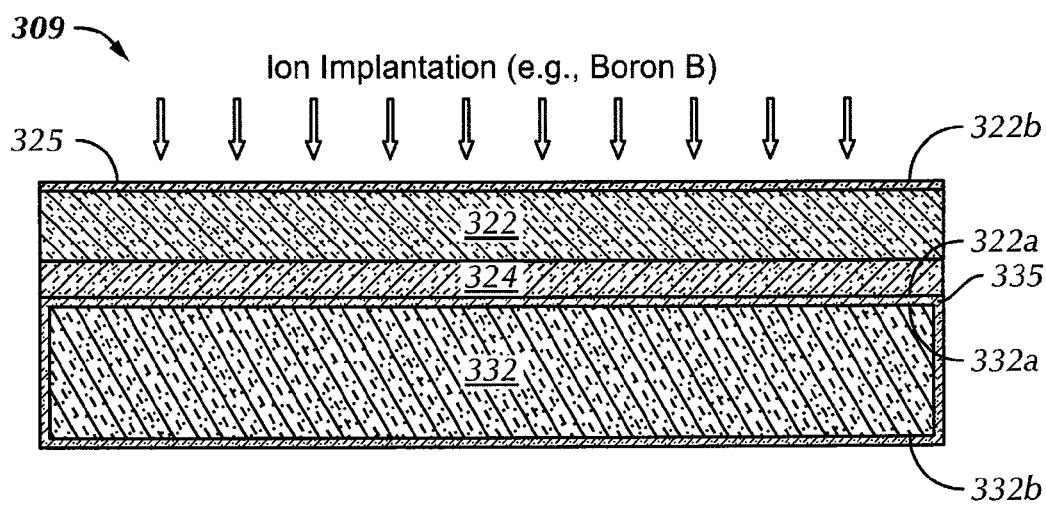
FIG. 4D is a partial cross-sectional side elevational view of the double-layer bonded-wafer device of FIG. 4C being doped.
Figure 4E:
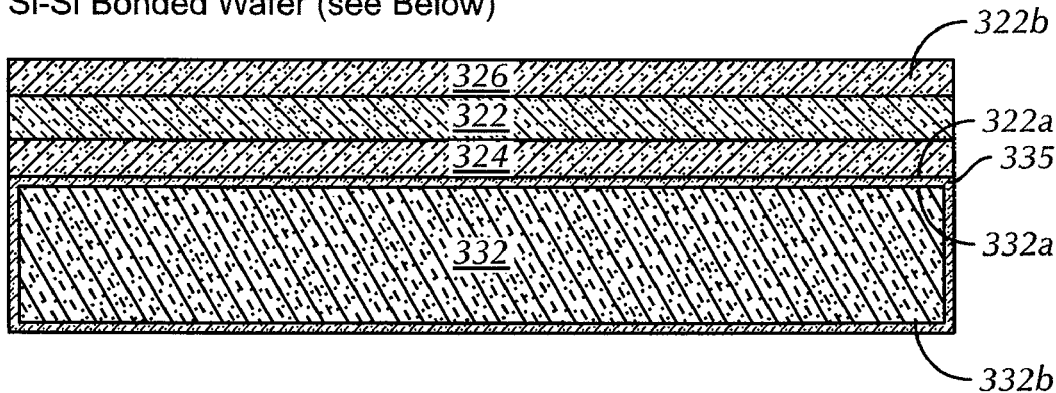
FIG. 4E is a partial cross-sectional side elevational view of the triple-layer bonded-wafer device of FIG. 4D during a thermal drive-in step performed.

FIG. 4D shows that the second main surface 322b of the device wafer 322 is then ground and polished to a desired thickness prior to a second doping step. The second main surface 322b of the device wafer 322 is also doped with a dopant by ion implantation. The doping results in a second doped region 325 proximate the second main surface 322b that is of a second conductivity different than the first conductivity such as the other of n-type or p-type. For example, if the device wafer 322 is n-type, then the second main surface 322b may be, for example, implanted with a p-type dopant such as boron; and if the device wafer 322 is p-type, then the second main surface 322b may be, for example, implanted with an n-type dopant such as phosphorous. The intermediate multi-layer device 309 is then subjected to another heating cycle to drive the dopant into the device wafer 322 thereby converting the second doped region 325 into a third device layer 326 and creating a triple-layer bonded-wafer device 310 of FIG. 4E, similar to the second preferred embodiment. The heating cycle may be, for example, at a temperature of about 700°-1200° C. for a few minutes to several hours. The longer the drive-in heating cycle, the more the dopants will diffuse into the device wafer 322, so the heating time is selected to achieve the desired diffusion depth.

Figure 4F:
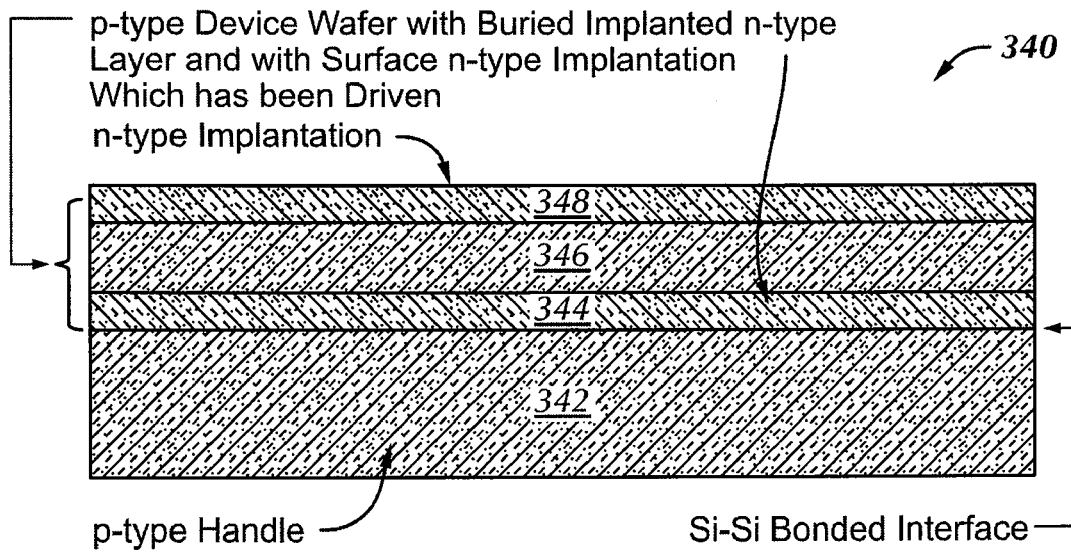
FIG. 4F is a partial cross-section side elevational view of a tetrad-layer bonded-wafer device in accordance with the third preferred embodiment.

FIG. 4F is a partial cross-section side elevational view of a tetrad-layer bonded-wafer device 340. The tetrad-layer bonded-wafer device 340 includes a seventh device layer 342 of the second conductivity, a sixth device layer 344 of the first conductivity, a fifth device layer 346 of the second conductivity and a fourth device layer 348 of the first conductivity. At this stage, the seventh device layer 342 is thicker than the fourth-sixth device layers 348, 346, 344 so that the seventh device layer 342 functions as a handle layer 342 during processing (i.e., a handle layer being a mechanical support layer to the other layers that can be somewhat "handled" during processing). The tetrad-layer bonded-wafer device 340 could be formed similar to the upper layers of the second or third preferred embodiments by either direct bonding of selected conductivity substrate materials, by doping and drive-in to create layers within a selected conductivity substrate material and combinations thereof. Notably, the tetrad-layer bonded-wafer device 340 can be processed in parallel to the triple-layer bonded-wafer device 310 (FIG. 4E) thereby reducing overall processing time and reducing the number of heating cycles the lower device layers 324, 322, 326 are subjected to during processing.

Figure 4G:
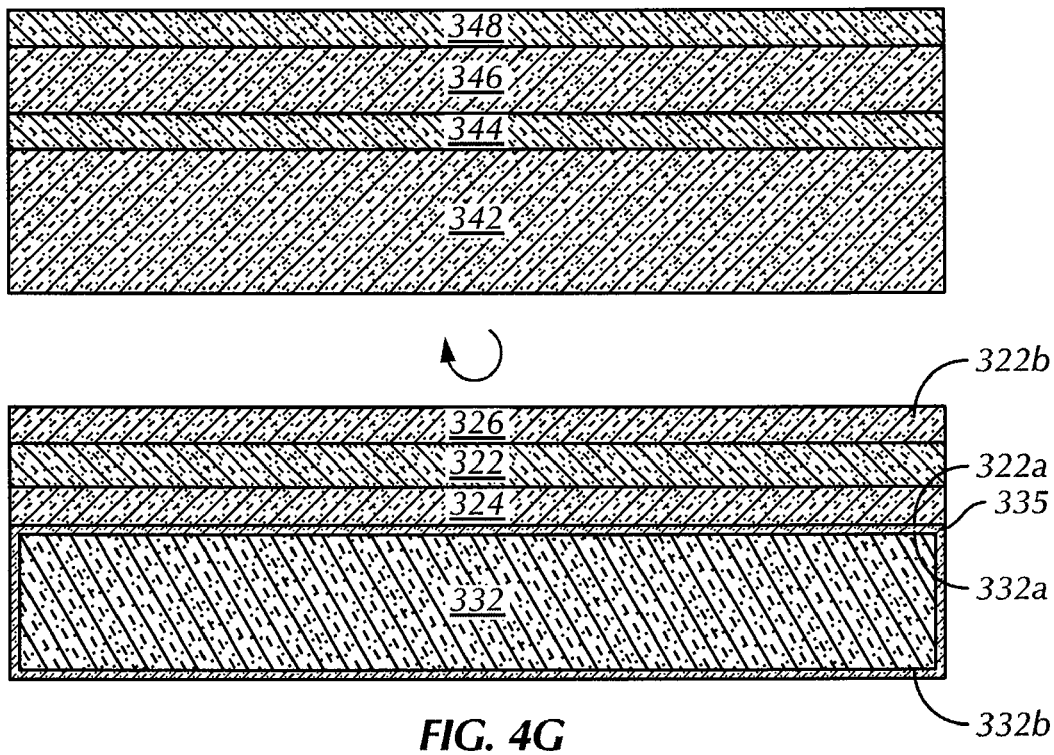
FIG. 4G is a partial cross-sectional side elevational view of the tetrad-layer device wafer of FIG. 4F being arranged to be bonded to the triple-layer bonded-wafer device of FIG. 4E.
Figure 4H:
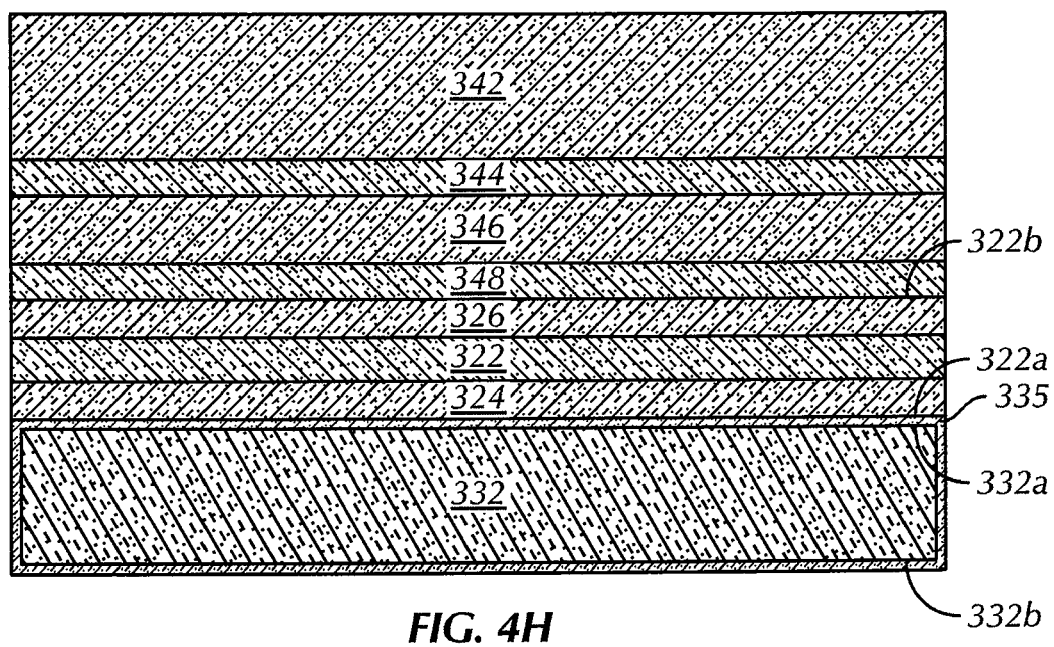
FIG. 4H is a partial cross-sectional side elevational view of the tetrad-layer device wafer of FIG. 4F being bonded to the triple-layer bonded-wafer device of FIG. 4E.
Figure 4I:
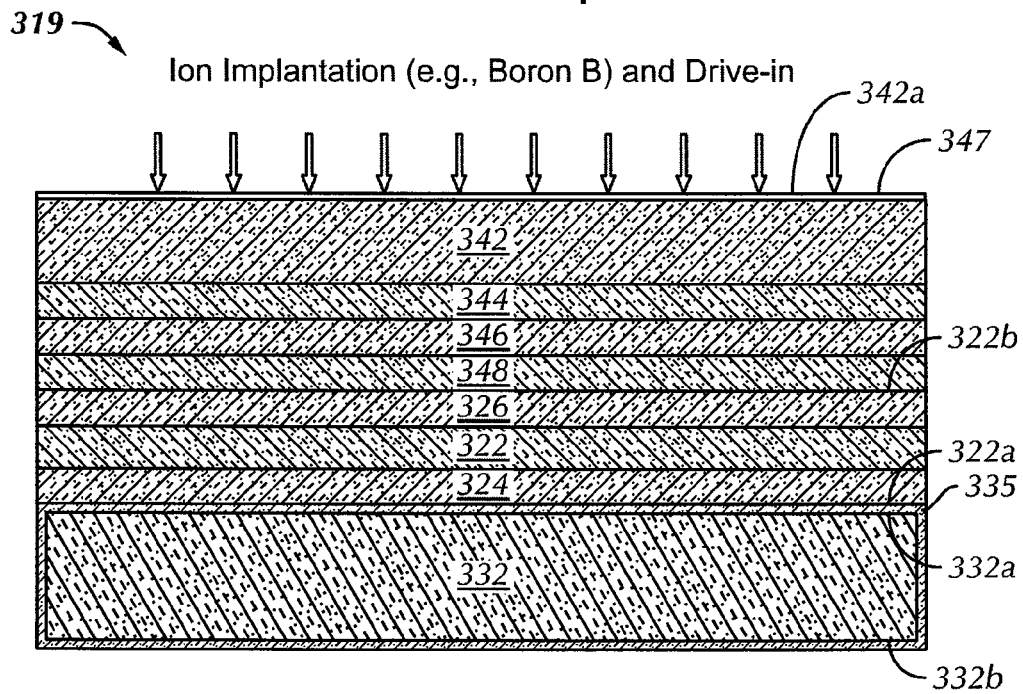
FIG. 4I is a partial cross-sectional side elevational view of a heptad-layer bonded-wafer superjunction device formed by the bonding of the devices of FIG. 4H being ground, polished and doped.

FIG. 4G shows the tetrad-layer device wafer 340 being arranged to be bonded to the triple-layer bonded-wafer device 310. The device wafer 340 is arranged so that the fourth layer 348 of the first conductivity is aligned with the third (uppermost) device layer 326 of the second conductivity. In FIG. 4H, the tetrad-layer device wafer 340 is bonded by an annealing/bonding cycle to the triple-layer bonded-wafer device 310 by silicon-to-silicon bonding (Si—Si). The annealing/bonding cycle may be at a temperature of about 700°-1200° C. and this may be for a few minutes to several hours. FIG. 4I shows an intermediate heptad-layer bonded-wafer device 319 after the seventh layer 342, now the uppermost layer of the intermediate heptad-layer bonded-wafer device 319, is ground and polished. The doping and thickness of the various layers 324, 322, 326, 348, 346, 344, 342 are chosen to achieve the desired charge balance. Similarly, the handle wafer 332 may also be ground and polished (i.e., thinned) to affect the overall charge balance in a similar manner.

The exposed surface 342a of the seventh layer 342 is then doped with a dopant by ion implantation. The doping results in a doped region 347 proximate the exposed surface 342a that is of a first conductivity such as the other of n-type or p-type. For example, if the seventh layer 342 is n-type, then the exposed surface 342a is implanted with a p-type dopant such as boron; and if the seventh layer 342 is p-type, then the exposed surface 342a is implanted with an n-type dopant such as phosphorous. The intermediate heptad-layer device 319 is then subjected to another heating cycle to drive the dopant into the seventh layer 342 thereby converting the doped region 347 into an eighth device layer 349 and creating the octad-layer bonded-wafer device 359 of FIG. 4J. The heating cycle may be, for example, at a temperature of about 700°-1200° C. for a few minutes to several hours. The longer the drive-in heating cycle, the more the dopants will diffuse into the device wafer 322, so the heating time is selected to achieve the desired diffusion depth.

Figure 4J:
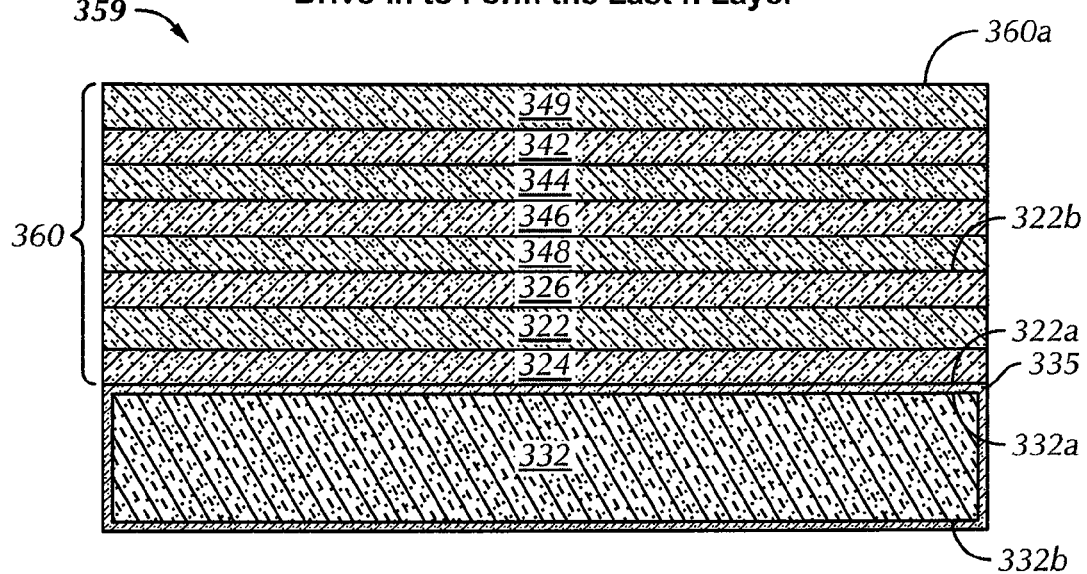
FIG. 4J is a partial cross-sectional side elevational view of an octad-layer bonded-wafer superjunction device after a drive-in step is performed on the doped heptad-layer bonded-wafer superjunction device of FIG. 4I.
Figure 4K:
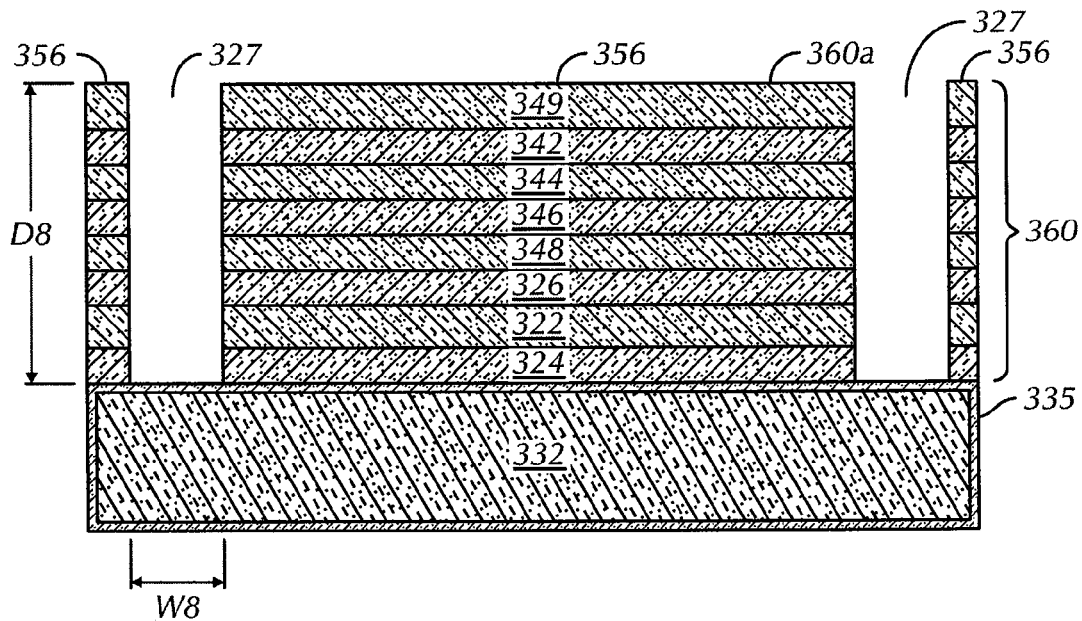
FIG. 4K is a partial cross-sectional side elevational view of the octad-layer bonded-wafer superjunction device of FIG. 4J being trenched.

Referring to FIG. 4K, the octad-layer bonded-wafer superjunction device 359 of FIG. 4J is trenched by etching to form a plurality of trenches 327 which define a plurality of mesas 356. The octad-layer bonded-wafer superjunction device 359 includes an octad-layer device stack 360 having a main surface 360a. The octad-layer device stack 360 comprises the layers 324, 322, 326, 348, 346, 344, 342, 349 of alternating conductivity such as n-p-n-p-n-p-n-p or p-n-p-n-p-n-p-n. The plurality of trenches 327 may be formed in the first main surface 360a of the device stack 360 by a process such as plasma etching, reactive ion etching (RIE), sputter etching, vapor phase etching, chemical etching and the like. Utilizing deep RIE, trenches 327 can be formed having depths D of about 40 to 100 μm or even deeper. Preferably, the plurality of trenches 327 thereby define a plurality of mesas 356 in the first main surface 360a.

The sidewalls of each trench 327 may be smoothed, if needed, using one or more of the following process steps:
  (i) an isotropic plasma etch may be used to remove a thin layer of silicon (typically 100-1000 Angstroms (Å)) from the trench surfaces.
  (ii) a sacrificial silicon dioxide ($SiO_2$) layer may be grown on the surfaces of the trench and then removed using an etch such as a buffered oxide etch or a diluted hydrofluoric (HF) acid etch.

The use of either or both of these techniques can produce smooth trench surfaces with rounded corners while removing residual stress and unwanted contaminates. However, where it is desirable to have vertical sidewalls and square corners, an anisotropic etch process may be used instead of the isotropic etch process discussed above. Anisotropic etching, in contrast to isotropic etching, generally means different etch rates in different directions in the material being etched (e.g., may etch more rapidly vertically than horizontally permitting deeper directed trenching).

Figure 4L:
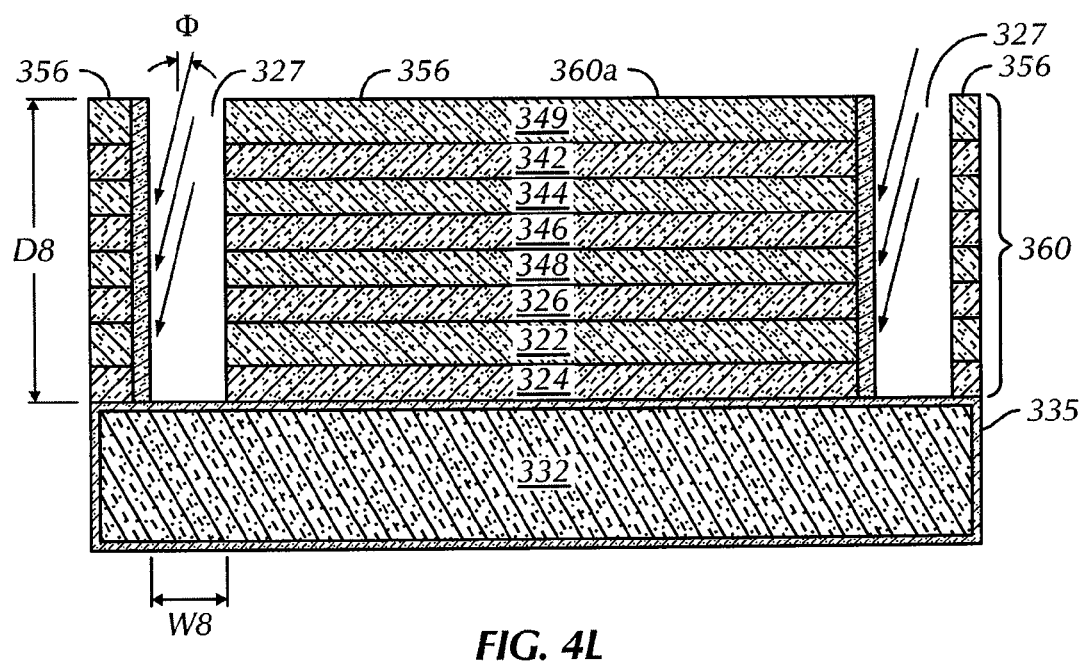
FIG. 4L is a partial cross-sectional side elevational view of the octad-layer bonded-wafer superjunction device of FIG. 4K being implanted.
Figure 4M:
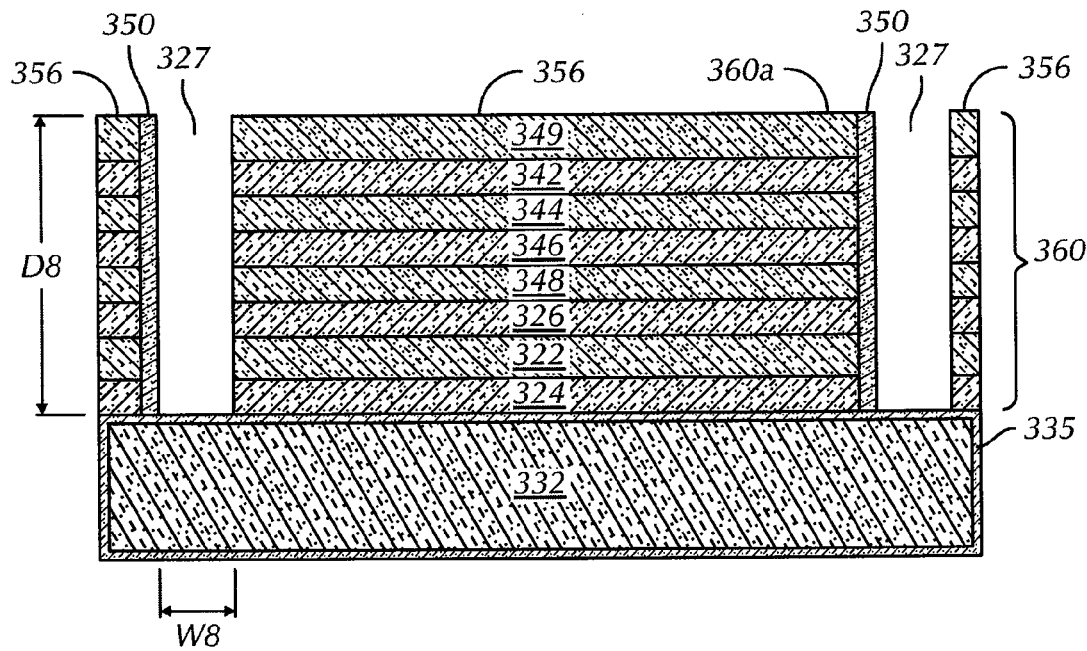
FIG. 4M is a partial cross-sectional side elevational view of the octad-layer bonded-wafer superjunction device of FIG. 4L during drive-in and diffusion.

Referring to FIG. 4L, one side of each mesa 356 of the octad-layer device stack 360 is selectively implanted with a dopant such as boron or phosphorous. The dopant is preferably implanted at a predetermined angle Φ to sufficiently implant one side of the mesas 356. At the slight angle Φ, with or without a masking step, the mesas 356 are implanted on one side at a high energy level in the range of about 40 to 1000 kilo-electronvolts (KeV). Preferably, the energy level is in the range of about 200 to 1000 KeV, but it should be recognized that the energy level should be selected to sufficiently implant the dopant. The predetermined angle of implant Φ, as represented by the arrows, is determined by the width W8 between the mesas 356 and the depth D8 of the trenches 327 and may be, for example, between about 2° and 12° from vertical with respect to the first main surface 360a of the octad-layer device stack 360. Consequently, a dopant of the second conductivity type is implanted, at a predetermined angle of implant Φ, into one side of the plurality of mesas 356. FIG. 4M shows a drive-in and diffusion of the implanted dopant to create a heavily doped layer 350 of the second conductivity.

Figure 4N:
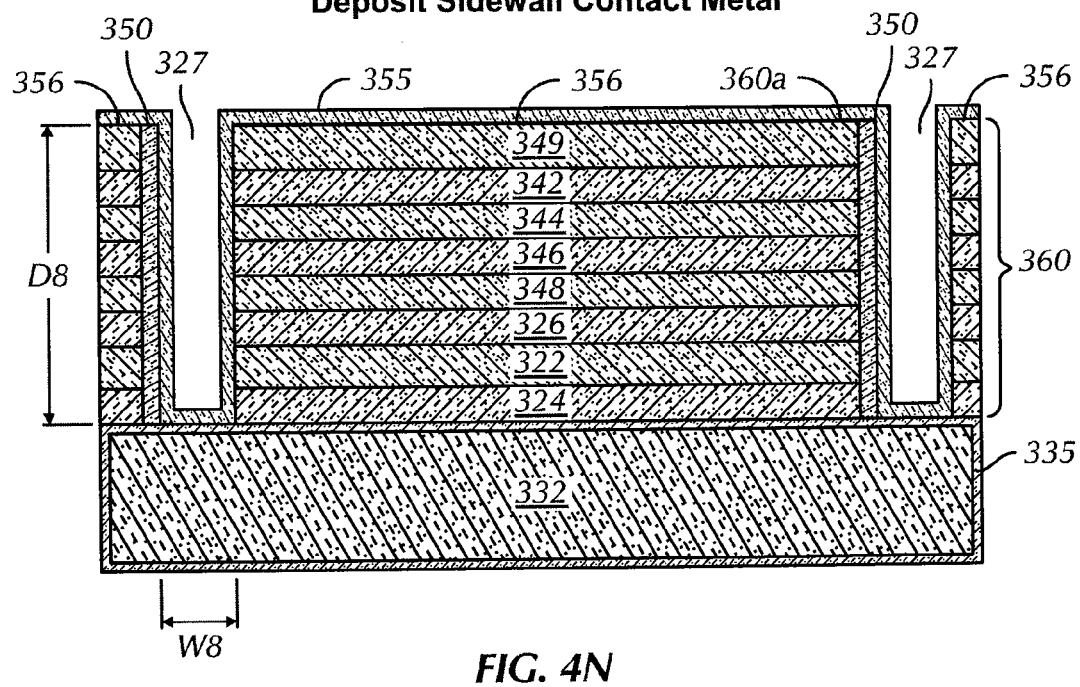
FIG. 4N is a partial cross-sectional side elevational view of the octad-layer bonded-wafer superjunction device of FIG. 4M having a contact metal deposited thereon.
Figure 4O:
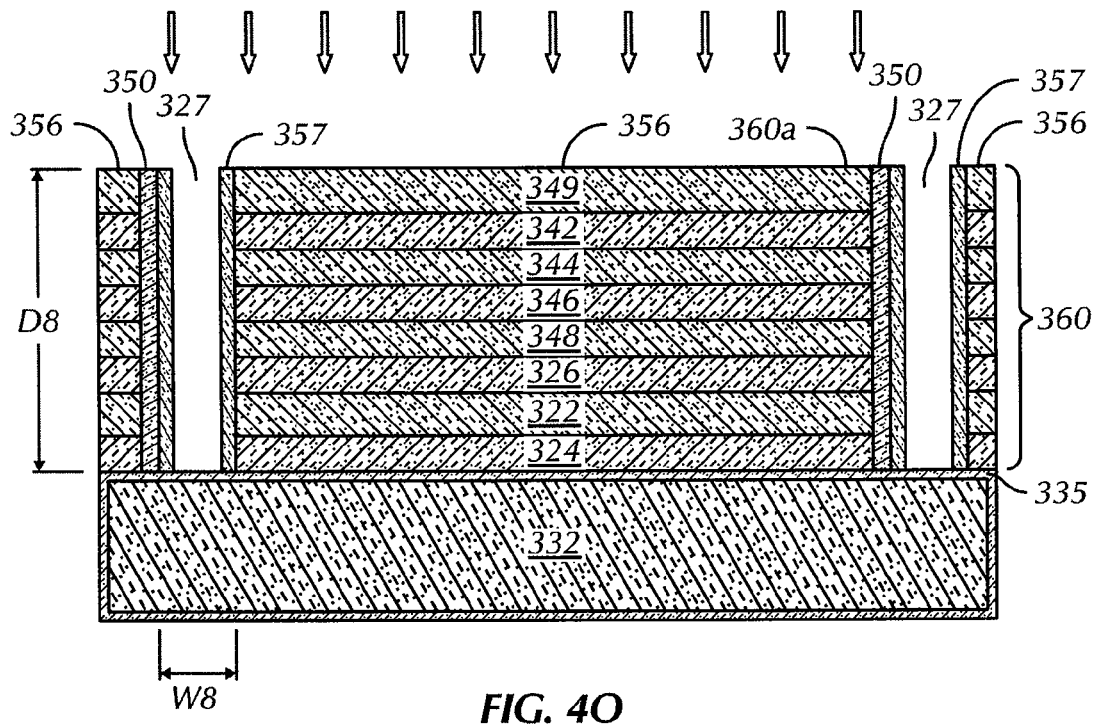
FIG. 4O is a partial cross-sectional side elevational view of the octad-layer bonded-wafer superjunction device of FIG. 4N during an etch process.
Figure 4P:
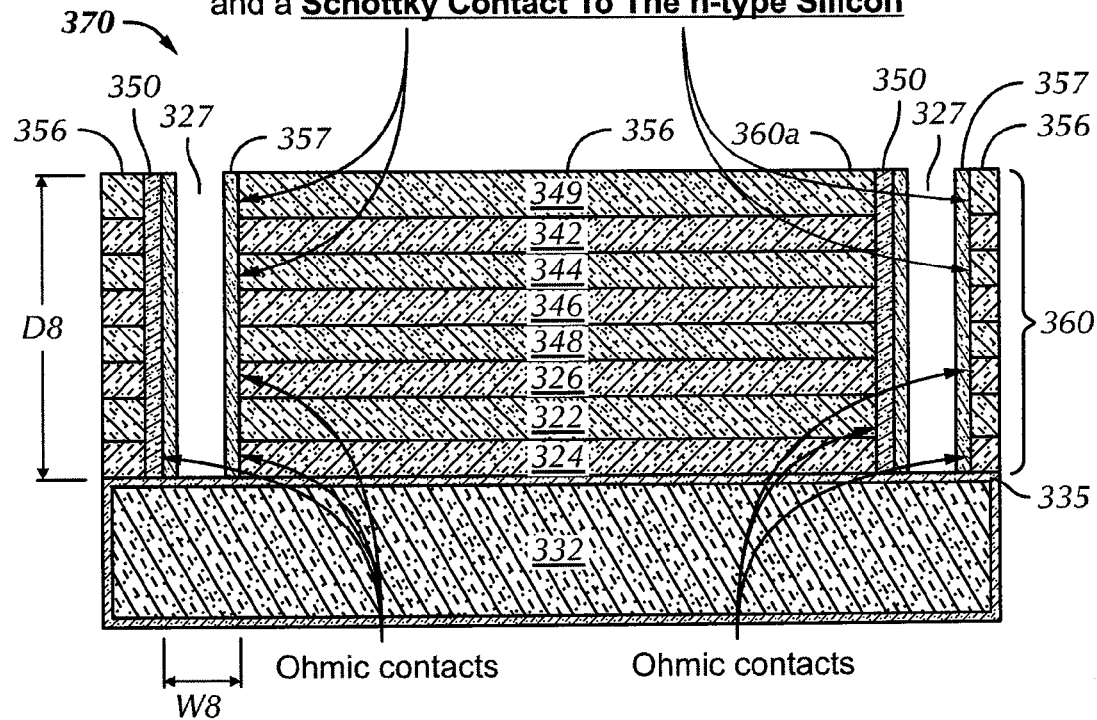
FIG. 4P is a partial cross-sectional side elevational view of the octad-layer bonded-wafer superjunction device having Ohmic and/or Schottky contacts in accordance with the third preferred embodiment of the present invention.

In FIG. 4N, a layer of contact metal 355 is deposited on the mesas 356 and lines the trenches 327. The contact metal 355 may be deposited by sputtering, evaporation, electroplating and the like. Optionally, the contact metal 355 may be used to completely fill the trenches 327 and cover the mesas 356. The metal contact layer 355 may be, for example, a metal such as aluminum Al, aluminum silicon Al[% Si], copper Cu, gold Au, silver Ag, titanium Ti, tungsten W, nickel Ni and the like and combinations thereof or may be doped or undoped polysilicon. The metal contact layer 355 may also be layers of differing metals. Using lithography or masking, the contact metal 355 in the center of the trenches 327 can be selectively removed thereby ensuring a better contact with the heavily doped layer 350 and the other, undoped-side of the mesas 356. FIG. 4O shows that an anisotropic etch process is performed to remove portions of the layer of contact metal 355 from the mesas 356 and bottoms 327a of the trenches 327 in order to leave contacts 357 on the heavily doped layer 350 and the other, undoped-side of the mesas 356.

FIG. 4P is a partial cross-sectional side elevational view of the octad-layer bonded-wafer superjunction device 370 having ohmic and/or Schottky contacts. Thus, depending on the particular type of metal layer 355 selected to form the metal contacts 370, it is possible to form ohmic contacts to the first or second conductivity layers 322, 348, 344, 349 or 324, 326, 346, 342.

As shown in FIG. 4, the metal contact 357 directly in contact with the first and second conductivity layers 322, 348, 344, 349 and 324, 326, 346, 342 forms a Schottky barrier anode and the metal contact 357 overlying the heavily doped layer 350 of the second conductivity forms an ohmic contact cathode. Therefore, one mesa 356 of first or second conductivity layers 322, 348, 344, 349 or 324, 326, 346, 342 forms a lateral super unction Schottky diode wherein the blocking voltage is determined by the horizontal width of the mesa 356. Other multi-layered superjunction devices 370 can also be formed with different contact arrangements.

One benefit to forming two-halves of the octad-layer bonded-wafer 370, over building the eight layers individually, is the improvement in thermal efficiency or lessening of the thermal impact on the lowermost layers. If the eight layers were each built from the bottom up by epitaxy, the first layer would undergo at least eight high-temperature steps (i.e., a temperature in excess of 1000°C.), the second layer would undergo seven high-temperature steps, the third layer would undergo at least six high temperature steps and so on. In other words, for an n-layer device, the first layer would undergo n-1 high temperature steps, the second layer would undergo n-2 high temperature steps, and so on. However, when performing the method according to the third preferred embodiment of the invention, any particular layer will undergo no more than four high-temperature steps.

Moreover, another benefit to forming two-halves of the octad-layer bonded-wafer 370 is the reduced fabrication cycle time since each half can be processed in parallel.

For thick stacks of semiconductor layers 324, 322, 326, 348, 346, 344, 342, 349 such as stacks of 50 μm or greater, the bonding processes in accordance with the preferred embodiments are competitive with epitaxially grown semiconductor layers 324, 322, 326, 348, 346, 344, 342, 349, especially when the stacks of layers 324, 322, 326, 348, 346, 344, 342, 349 include alternately doped layers 324, 322, 326, 348, 346, 344, 342, 349.

Additional, n-p-n-p/p-n-p-n layers 348, 346, 344, 342 can also be bonded to the uppermost device layer 349 to form additional multi-layer bonded-wafer devices 370 in a similar fashion.

From the foregoing, it can be seen that the embodiments of the present invention are directed to a bonded-wafer semiconductor device and methods for manufacturing a bonded-wafer semiconductor device. It will be appreciated by those skilled in the art that changes could be made to the embodiments described above without departing from the broad inventive concept thereof. It is understood, therefore, that the embodiments of the invention are not limited to the particular embodiments disclosed, but are intended to cover modifications within the spirit and scope of the present invention as defined by the appended claims.

Although embodiments of the present invention have been described with respect to superjunction devices, it will be understood by those skilled in the art that the embodiments of the present invention should not be limited strictly thereto.

Although shown as n-p-n or p-n-p, alternatively, alternating layers of heavily doped, lightly doped and/or very heavily doped n-type or p-type layers of the same conductivity type can be stacked without departing from scope of the various embodiments of the invention. For example, layers of $(p^{++})$-$(p^-)$ or $(p^+)$-$(p^-)$ or $(p^-)$-$(p^{--})$ may be alternated and/or $(n^{++})$-$(n^-)$ or $(n^+)$-$(n^-)$ or $(n^-)$-$(n^{--})$ may be alternated. Likewise, combinations of heavily doped, lightly doped and/or very heavily doped n-type and p-type layers may be provided using similar techniques as described above without departing from scope of the various embodiments of the invention.

We claim:

1. A method of manufacturing a bonded-wafer semiconductor device comprising:
   providing a first semiconductor substrate having first and second main surfaces opposite to each other;
   depositing an oxide layer on the first main surface of the first semiconductor substrate;
   providing a second semiconductor substrate having first and second main surfaces opposite to each other, the second semiconductor substrate being of a first conductivity;
   doping the first main surface of the second semiconductor substrate with a first dopant of a second conductivity opposite to the first conductivity;
   placing the doped first main surface of the second semiconductor substrate onto the oxide layer on the first main surface of the first semiconductor substrate;
   annealing/bonding the second semiconductor substrate to the oxide layer thereby diffusing the first dopant into the second semiconductor substrate to create a first device layer of the second conductivity and a second device layer of the first conductivity;
   doping the second main surface of the second semiconductor substrate with a second dopant of the second conductivity; and
   diffusing the second dopant into the second semiconductor substrate to form a third device layer of the second conductivity.

2. The method according to claim 1, further comprising:
   providing a third semiconductor substrate having first and second main surfaces opposite to each other, the third semiconductor substrate being of the second conductivity;
   doping the first main surface of the third semiconductor substrate with a third dopant of the first conductivity;
   placing the doped first main surface of the third semiconductor substrate onto the third device layer on the second main surface of the second semiconductor substrate; and
   annealing/bonding the third semiconductor substrate to the third device layer of the second semiconductor substrate thereby diffusing the third dopant into the third semiconductor substrate to create a fourth device layer of the first conductivity and a fifth device layer of the second conductivity.

3. The method according to claim 2, further comprising:
   doping the second main surface of the third semiconductor substrate with a fourth dopant of the first conductivity; and
   diffusing the fourth dopant into the third semiconductor substrate to form a sixth device layer of the first conductivity.

4. The method according to claim 1, further comprising:
   grinding the first main surface of the second semiconductor substrate prior to doping.

5. The method according to claim 1, further comprising:
   grinding the second main surface of the second semiconductor substrate prior to doping.

6. The method according to claim 1, further comprising:
   polishing the first main surface of the second semiconductor substrate prior to doping.

7. The method according to claim 1, further comprising:
   polishing the second main surface of the second semiconductor substrate prior to doping.

8. The method according to claim 1, further comprising:
   grinding the first main surface of the second semiconductor substrate prior to doping; and
   polishing the first main surface of the second semiconductor substrate prior to doping.

9. The method according to claim 1, further comprising:
   grinding the second main surface of the second semiconductor substrate prior to doping; and
   polishing the second main surface of the second semiconductor substrate prior to doping.

10. The method according to claim 1, further comprising:
    forming at least one semiconductor device using the first, second and third device layers.

11. A bonded-wafer semiconductor device formed by the method according to claim 1.

12. A method of manufacturing a bonded-wafer semiconductor device comprising:
    providing a first semiconductor substrate having first and second main surfaces opposite to each other;
    depositing an oxide layer on the first main surface of the first semiconductor substrate;
    providing a second semiconductor substrate having first and second main surfaces opposite to each other, the second semiconductor substrate being of a first conductivity;
    placing the first main surface of the second semiconductor substrate onto the oxide layer on the first main surface of the first semiconductor substrate;
    annealing/bonding the second semiconductor substrate to the oxide layer to create a first device layer of the first conductivity;
    providing a third semiconductor substrate having first and second main surfaces opposite to each other, the third semiconductor substrate being of the second conductivity;
    placing the first main surface of the third semiconductor substrate onto the second main surface of second semiconductor substrate; and
    annealing/bonding the third semiconductor substrate to the second semiconductor substrate to create a second device layer of the first conductivity.

13. The method according to claim 12, wherein the second and third semiconductor substrates are silicon and the annealing/bonding step creates a silicon-to-silicon bond.

14. The method according to claim 12, further comprising: grinding/polishing the first main surface of the second semiconductor prior to placing the first main surface of the second semiconductor substrate onto the oxide layer.

15. The method according to claim 12, further comprising: grinding the first main surface of the third semiconductor substrate prior to placing the first main surface of the third semiconductor substrate onto the second main surface of second semiconductor substrate.

16. The method according to claim 12, further comprising: polishing the first main surface of the third semiconductor substrate prior to placing the first main surface of the third semiconductor substrate onto the second main surface of second semiconductor substrate.

17. The method according to claim 12, further comprising:

grinding the first main surface of the third semiconductor substrate prior to placing the first main surface of the third semiconductor substrate onto the second main surface of second semiconductor substrate; and polishing the first main surface of the third semiconductor substrate prior to placing the first main surface of the third semiconductor substrate onto the second main surface of second semiconductor substrate.

18. A bonded-wafer semiconductor device formed by the method according to claim 12.

* * * * *